(12) United States Patent
Linderman et al.

(10) Patent No.: US 8,991,682 B2
(45) Date of Patent: Mar. 31, 2015

(54) METHODS AND STRUCTURES FOR FORMING AND IMPROVING SOLDER JOINT THICKNESS AND PLANARITY CONTROL FEATURES FOR SOLAR CELLS

(71) Applicant: Sunpower Corporation, San Jose, CA (US)

(72) Inventors: Ryan Linderman, Oakland, CA (US); Thomas Phu, Alameda, CA (US)

(73) Assignee: Sunpower Corporation, San Jose, CA (US)

( * ) Notice: Subject to any disclaimer, the term of this patent is extended or adjusted under 35 U.S.C. 154(b) by 0 days.

(21) Appl. No.: 14/162,619

(22) Filed: Jan. 23, 2014

(65) Prior Publication Data

US 2014/0137922 A1 May 22, 2014

Related U.S. Application Data

(63) Continuation of application No. 13/802,421, filed on Mar. 13, 2013, now Pat. No. 8,636,198.

(60) Provisional application No. 61/707,851, filed on Sep. 28, 2012.

(51) Int. Cl.
*B23K 31/02* (2006.01)
*H01L 31/042* (2014.01)
(Continued)

(52) U.S. Cl.
CPC .......... *H01L 31/0508* (2013.01); *B23K 1/0016* (2013.01); *B23K 1/002* (2013.01);
(Continued)

(58) Field of Classification Search
None
See application file for complete search history.

(56) References Cited

U.S. PATENT DOCUMENTS

| 3,446,676 | A | | 5/1969 | Goldsmith et al. |
| 3,574,925 | A | * | 4/1971 | Schneider et al. ....... 228/180.21 |

(Continued)

FOREIGN PATENT DOCUMENTS

| DE | 10041271 | 3/2002 |
| DE | 202004005198 | 8/2004 |

(Continued)

OTHER PUBLICATIONS

Bardwell, Karen et al., "Minimizing End Shadowing Effects on Parabolic Concentrator Arrays," IEEE, 1980, pp. 765-770.

(Continued)

*Primary Examiner* — Kiley Stoner
(74) *Attorney, Agent, or Firm* — Knobbe Martens Olson & Bear LLP

(57) ABSTRACT

A method for connecting a plurality of solar cells and an improved interconnect is disclosed. The method includes aligning an interconnect to a plurality of solar cells having solder pads, where the interconnect has a main body and tabs extending therefrom, and where each of the tabs has a downward depression, such that the tabs are positioned above the solder pads in between solar cells and pinning the interconnect against a work surface by pressing a hold down pin against the main body of the interconnect such that a lower surface of the interconnect tabs are maintained parallel to an upper surfaces of the solder pads, and such that the depression of each of the tabs flatly contacts the solder pads. The method can also include cantilevered tabs extending downwardly from the main body providing a controlled spring force between the tab lower surface and the solder pad upper surface.

19 Claims, 20 Drawing Sheets

(51) Int. Cl.
*H01L 31/05* (2014.01)
*B23K 1/00* (2006.01)
*B23K 1/002* (2006.01)
*B23K 1/012* (2006.01)
*H01L 23/00* (2006.01)

(52) U.S. Cl.
CPC .............. *B23K 1/012* (2013.01); *H01L 24/34* (2013.01); *B23K 2201/38* (2013.01); *B23K 2203/10* (2013.01); *B23K 2203/12* (2013.01)
USPC ...... 228/180.21; 136/244; 136/252; 136/255; 136/256

(56) References Cited

U.S. PATENT DOCUMENTS

| | | | |
|---|---|---|---|
| 4,153,474 A | 5/1979 | Rex | |
| 4,301,322 A | 11/1981 | Amick | |
| 4,323,719 A | 4/1982 | Green | |
| 4,373,783 A | 2/1983 | Anderson | |
| 4,456,332 A | 6/1984 | Anderson | |
| 4,468,848 A | 9/1984 | Anderson et al. | |
| 4,468,849 A | 9/1984 | Anderson et al. | |
| 4,481,378 A | 11/1984 | Lesk | |
| 4,502,200 A | 3/1985 | Anderson et al. | |
| 4,640,734 A | 2/1987 | Roberts et al. | |
| 4,643,543 A | 2/1987 | Mohn et al. | |
| 4,643,544 A | 2/1987 | Loughran | |
| 4,759,803 A | 7/1988 | Cohen | |
| 5,017,243 A * | 5/1991 | Otsubo | 136/244 |
| 5,180,441 A | 1/1993 | Cornwall et al. | |
| 5,248,346 A | 9/1993 | Fraas et al. | |
| 5,298,768 A | 3/1994 | Okazaki et al. | |
| 5,334,496 A | 8/1994 | Pond et al. | |
| 5,344,496 A | 9/1994 | Stern et al. | |
| 5,389,158 A | 2/1995 | Fraas et al. | |
| 5,409,549 A | 4/1995 | Mori | |
| 5,441,577 A * | 8/1995 | Sasaki et al. | 136/244 |
| 5,498,297 A | 3/1996 | O'Neill et al. | |
| 5,580,395 A | 12/1996 | Yoshioka et al. | |
| 5,616,185 A | 4/1997 | Kukulka | |
| 5,660,644 A | 8/1997 | Clemens | |
| 5,697,192 A | 12/1997 | Inoue | |
| 5,865,905 A | 2/1999 | Clemens | |
| 5,899,199 A | 5/1999 | Mills | |
| 5,990,415 A | 11/1999 | Green et al. | |
| 6,034,322 A | 3/2000 | Pollard | |
| 6,131,565 A | 10/2000 | Mills | |
| 6,198,171 B1 | 3/2001 | Huang et al. | |
| 6,323,478 B1 | 11/2001 | Fujisaki et al. | |
| 6,359,209 B1 | 3/2002 | Glenn et al. | |
| 6,402,881 B1 | 6/2002 | Carey et al. | |
| 6,442,937 B1 | 9/2002 | Stone | |
| 6,531,328 B1 | 3/2003 | Chen | |
| 6,553,729 B1 | 4/2003 | Nath et al. | |
| 6,607,942 B1 | 8/2003 | Tsao et al. | |
| 6,635,507 B1 | 10/2003 | Boutros et al. | |
| 7,183,587 B2 | 2/2007 | Negley et al. | |
| 7,304,326 B2 | 12/2007 | Suehiro et al. | |
| 7,468,485 B1 | 12/2008 | Swanson | |
| 7,554,031 B2 | 6/2009 | Swanson et al. | |
| 7,709,730 B2 | 5/2010 | Johnson et al. | |
| 7,714,341 B2 | 5/2010 | Chil Keun et al. | |
| 7,820,906 B2 | 10/2010 | Johnson et al. | |
| 7,825,327 B2 | 11/2010 | Johnson et al. | |
| 7,906,793 B2 | 3/2011 | Negley | |
| 7,932,461 B2 | 4/2011 | Johnson et al. | |
| 7,952,057 B2 | 5/2011 | Johnson et al. | |
| 7,968,791 B2 | 6/2011 | Do et al. | |
| 8,039,777 B2 | 10/2011 | Lance et al. | |
| 8,049,150 B2 | 11/2011 | Johnson et al. | |
| 8,071,930 B2 | 12/2011 | Wylie et al. | |
| 8,125,000 B2 | 2/2012 | Kim et al. | |
| 8,530,990 B2 | 9/2013 | Linderman et al. | |
| 8,636,198 B1 | 1/2014 | Linderman et al. | |
| 2002/0059952 A1 | 5/2002 | Shimada | |
| 2004/0074490 A1 | 4/2004 | Mills et al. | |
| 2005/0035444 A1 | 2/2005 | Huang | |
| 2005/0268959 A1 | 12/2005 | Aschenbrenner et al. | |
| 2006/0054210 A1 | 3/2006 | Proisy et al. | |
| 2006/0060867 A1 | 3/2006 | Suehiro | |
| 2006/0097385 A1 | 5/2006 | Negley et al. | |
| 2006/0124953 A1 | 6/2006 | Negley et al. | |
| 2006/0170094 A1 | 8/2006 | Subramanian et al. | |
| 2007/0074755 A1 | 4/2007 | Eberspacher et al. | |
| 2007/0151598 A1 | 7/2007 | De Ceuster et al. | |
| 2007/0257274 A1 | 11/2007 | Martter et al. | |
| 2007/0283996 A1 * | 12/2007 | Hachtmann et al. | 136/244 |
| 2008/0011348 A1 | 1/2008 | Aoyama et al. | |
| 2008/0035198 A1 | 2/2008 | Teppe et al. | |
| 2008/0053523 A1 * | 3/2008 | Brown et al. | 136/256 |
| 2008/0083450 A1 | 4/2008 | Benoit et al. | |
| 2008/0121266 A1 * | 5/2008 | Tsunomura et al. | 136/244 |
| 2008/0230117 A1 | 9/2008 | Katayama et al. | |
| 2008/0289680 A1 | 11/2008 | MacFarlane | |
| 2009/0001140 A1 | 1/2009 | Katayama et al. | |
| 2009/0025782 A1 * | 1/2009 | Ojima et al. | 136/255 |
| 2009/0032087 A1 | 2/2009 | Kalejs | |
| 2009/0032093 A1 | 2/2009 | Fang | |
| 2009/0056699 A1 | 3/2009 | Mills et al. | |
| 2009/0056784 A1 * | 3/2009 | Reinisch | 136/244 |
| 2009/0056785 A1 | 3/2009 | Johnson et al. | |
| 2009/0056786 A1 | 3/2009 | Johnson et al. | |
| 2009/0056787 A1 | 3/2009 | Johnson et al. | |
| 2009/0065043 A1 * | 3/2009 | Hadorn et al. | 136/244 |
| 2009/0095284 A1 | 4/2009 | Klotz | |
| 2009/0134421 A1 | 5/2009 | Negley | |
| 2009/0139557 A1 | 6/2009 | Rose et al. | |
| 2009/0159116 A1 | 6/2009 | Umetani et al. | |
| 2009/0215304 A1 | 8/2009 | Faust et al. | |
| 2009/0266579 A1 | 10/2009 | Hofmuller et al. | |
| 2009/0272419 A1 | 11/2009 | Sakamoto et al. | |
| 2009/0277491 A1 * | 11/2009 | Nakamura et al. | 136/244 |
| 2010/0116323 A1 * | 5/2010 | Katayama et al. | 136/251 |
| 2010/0139742 A1 | 6/2010 | Wayman et al. | |
| 2010/0147364 A1 | 6/2010 | Gonzalez et al. | |
| 2010/0154788 A1 | 6/2010 | Wells et al. | |
| 2010/0163014 A1 | 7/2010 | Johnson et al. | |
| 2010/0193014 A1 | 8/2010 | Johnson et al. | |
| 2010/0236626 A1 | 9/2010 | Finot et al. | |
| 2010/0240153 A1 * | 9/2010 | Tabe | 438/4 |
| 2010/0263706 A1 * | 10/2010 | Isono et al. | 136/244 |
| 2010/0294336 A1 | 11/2010 | Johnson et al. | |
| 2010/0319682 A1 | 12/2010 | Klotz | |
| 2010/0326492 A1 | 12/2010 | Tan et al. | |
| 2011/0012264 A1 | 1/2011 | Linderman et al. | |
| 2011/0030764 A1 | 2/2011 | Seo et al. | |
| 2011/0061724 A1 | 3/2011 | Houle et al. | |
| 2011/0073165 A1 * | 3/2011 | Lee | 136/251 |
| 2011/0073166 A1 | 3/2011 | Lee | |
| 2011/0111534 A1 | 5/2011 | Gudel et al. | |
| 2011/0132457 A1 | 6/2011 | Finot | |
| 2011/0163085 A1 | 7/2011 | Kalmbach et al. | |
| 2011/0186130 A1 | 8/2011 | Finot et al. | |
| 2011/0226310 A1 | 9/2011 | Johnson et al. | |
| 2011/0240337 A1 * | 10/2011 | Montello et al. | 174/126.1 |
| 2011/0265871 A1 | 11/2011 | Lamarche | |
| 2011/0277814 A1 * | 11/2011 | Kyoda et al. | 136/244 |
| 2012/0012156 A1 | 1/2012 | Linderman et al. | |
| 2012/0034799 A1 | 2/2012 | Hunt | |
| 2012/0074576 A1 | 3/2012 | Linderman et al. | |
| 2012/0160294 A1 * | 6/2012 | Phu et al. | 136/244 |
| 2012/0285513 A1 * | 11/2012 | Croft et al. | 136/251 |
| 2013/0042960 A1 | 2/2013 | Luechinger et al. | |
| 2013/0048047 A1 | 2/2013 | Fujii et al. | |
| 2013/0098423 A1 * | 4/2013 | Shimasaki et al. | 136/244 |
| 2013/0112735 A1 * | 5/2013 | Luechinger et al. | 228/110.1 |
| 2013/0122632 A1 * | 5/2013 | Kawashita | 438/64 |
| 2013/0206062 A1 | 8/2013 | Cobb et al. | |
| 2013/0206204 A1 * | 8/2013 | Yoshida et al. | 136/244 |
| 2013/0233375 A1 | 9/2013 | Hamaguchi et al. | 136/251 |
| 2013/0255748 A1 | 10/2013 | Miyamoto | 136/244 |
| 2014/0048306 A1 * | 2/2014 | Yang et al. | 174/133 R |

(56) References Cited

U.S. PATENT DOCUMENTS

FOREIGN PATENT DOCUMENTS

| GB | 2340993 | 3/2000 |
| JP | 2001-298134 | 10/2001 |
| JP | 2004-253475 A * | 9/2004 |
| JP | 2006-019532 | 1/2006 |
| JP | 2007184542 | 7/2007 |
| JP | 2007194521 | 8/2007 |
| JP | 2007214247 | 8/2007 |
| JP | 2008-235549 | 10/2008 |
| KR | 1020070070183 | 7/2007 |
| KR | 1020090014153 | 2/2009 |
| WO | WO9957493 | 11/1999 |
| WO | WO2007096157 | 8/2007 |
| WO | WO2007096158 | 8/2007 |
| WO | WO2008022409 | 2/2008 |
| WO | WO2008153922 | 12/2008 |
| WO | WO2009023063 | 2/2009 |
| WO | WO2009029275 | 3/2009 |
| WO | WO2009029277 | 3/2009 |
| WO | WO 2009/110757 | 9/2009 |

OTHER PUBLICATIONS

Carroll, Don et al. "Production of the Alpha Solarco Proof-of-Concept Array," IEEE, 1990, pp. 1136-1141.
Edenburn, Michael W., et al. "Shading Analysis of a Photovoltaic Cell String Illuminated by a Parabolic Trough Concentrator," IEEE, 1981, pp. 63-68.
Shepard, Jr., N. F. et al., "The Integration of Bypass Diodes with Terrestrial Photovoltaic Modules and Arrays," IEEE, 1984, pp. 676-681.
Stern, T. G., "Interim results of the SLATS concentrator experiment on LIPS-II (space vehicle power plants)," Photovoltaic Specialists Conference, 1988., Conference Record of the Twentieth IEEE , vol., No., pp. 837-840 vol. 2, 1988. URL: http://ieeexplore.ieee.org/stamp/stamp.jsp?tp=&arnumber=105822&isnumber=3239.
Vivar Garcia, Marta, "Optimisation of the Euclides Photovoltaic Concentrator," 2009, 390 pages.
International Search Report and Written Opinion of PCT/US2011/044747, filed Jul. 20, 2011, dated Mar. 6, 2012.
Quagan, Robert J., "Laser Diode Heat Spreaders," Ion Beam Milling, Inc., website copyright 2010, http://www.ionbeammilling.com/default.asp, 9 pgs.
International Search Report and Written Opinion dated Jul. 21, 2011, International Appl. No. PCT/US2010/056386 (filed Nov. 11, 2010), 10 pages.
International Search Report and Written Opinion dated Jan. 25, 2011, International Appl. No. PCT/US2010/040884, 6 pages.
International Search Report and Written Opinion issued Jan. 21, 2014, International Appl. No. PCT/US2013/061231, 11 pages.

* cited by examiner

METHODS AND STRUCTURES FOR FORMING AND IMPROVING SOLDER JOINT THICKNESS AND PLANARITY CONTROL FEATURES FOR SOLAR CELLS

CROSS-REFERENCE TO RELATED APPLICATIONS

This application is a continuation of U.S. patent application Ser. No. 13/802,421, filed on Mar. 13, 2013, now U.S. Pat. No. 8,636,198 entitled "METHODS AND STRUCTURES FOR FORMING AND IMPROVING SOLDER JOINT THICKNESS AND PLANARITY CONTROL FEATURES FOR SOLAR CELLS," which claims the priority of U.S. Provisional Patent Application No. 61/707,851, filed Sep. 28, 2012, entitled "METHODS AND STRUCTURES FOR FORMING AND IMPROVING SOLDER JOINT THICKNESS AND PLANARITY CONTROL FEATURES FOR SOLAR CELLS," the disclosure of each of which is incorporated by reference herein in its entirety and for all purposes.

TECHNICAL FIELD

Embodiments of the subject matter described herein relate generally to photovoltaic assemblies including solar cells, photovoltaic modules and associated electronic components. More particularly, one or more embodiments of the present inventions relate to electrically connecting a plurality of solar cells in preparation for installation into photovoltaic modules.

BACKGROUND

Solar cells are well known devices for converting solar radiation to electrical energy. Several solar cells can be electrically connected together using one or more interconnects to form a solar cell array. The solar cell array can be packaged into a photovoltaic (PV) module using various processes and encapsulant materials.

Techniques for improving manufacturing processes related to electrically connecting solar cells are beneficial as these are intrinsic part of the standard photovoltaic (PV) module fabrication process. Such techniques may prevent solar cell cracking during solder joint formation, prevent contamination from solder residue and improve the positioning accuracy of a solder joint on a solar cell.

BRIEF SUMMARY

An aspect of at least one of the inventions disclosed herein includes the realization that although areas of thin-film solder electrically connecting interconnects with solar cells can fail due to the effects of thermal fatigue or other mechanisms, failure rates can be reduced by modifying the methods and/or hardware used to electrically connect interconnects with solar cells. For example, in some known solar cell arrays, interconnects can be electrically connected to solar cells with a soldering techniques that results in a wedge-shaped solder layer, a portion of which is thin. Inspection of failed solar cell arrays has revealed that the failure of the solder layer appears to emanate from these thin areas of a wedge-shaped solder layer.

An aspect of the least one of the inventions disclosed herein includes the realization that by forming a thicker solder layer around a thin solder layer can help prevent the thin solder layer from failing. For example, by surrounding a thin solder layer with a thicker solder layer, growth of cracks that might emanate from the same solder layer can be reduced, slowed, or eliminated.

In accordance with at least one of the embodiments disclosed herein, a method for connecting solar cells can include positioning a first solar cell adjacent to a second solar cell, each solar cell having a plurality of solder pads. The method can also include aligning a first interconnect to the first and second solar cells where the first interconnect has a main body and tabs extending therefrom, and where each of the tabs has a downward depression, such that lower surfaces of the tabs are positioned above the upper surface of the solder pads of both the first and second solar cells. The method can also include pinning the first interconnect against a work surface by pressing a hold down pin against the main body of the first interconnect such that the lower surfaces of the interconnect tabs are maintained substantially parallel to the upper surfaces of the solder pads, and such that the depression of each of the tabs substantially flatly contacts one of the solder pads.

In some embodiments, a method for connecting solar cells can include forming a solder paste into a liquid state uniformly spread around the depression between the interconnect tabs and solder pads, thereby forming an electrical connection between the first and second solar cells. In another embodiment, the method can include allowing the solder pads on each solar cell to form in two rows along two opposite edges, each row of solder pads corresponds to and is electrically coupled to the positive or negative electrode of the solar cell, and where positioning a first solar cell adjacent to a second solar cell includes positioning the solder pads of a first electrode of the first solar cell proximate to the solder pads of the opposite electrode of the second solar cell. In still another embodiment, positioning a first solar cell adjacent to a second solar cell can include positioning the solder pads of the first solar cell proximate and perpendicular to the solder pads of the second solar cell.

In still another embodiment, positioning a first solar cell adjacent to a second solar cell can include positioning the solder pads of the first solar cell proximate and parallel to the solder pads of the second solar cell. In some embodiments, the method can further include depositing solder paste on the plurality of solder pads prior to aligning the first interconnect to the first and second solar cells. In still another embodiment, the method can also include pre-applying the solder paste on the lower surface of the interconnect tabs prior to aligning the first interconnect to the first and second solar cells.

In another embodiment, pinning the first interconnect against a work surface allows for a contact force in the range of 0-1 Newtons between the lower surface of the tab and the upper surface of the solder pad. In still another embodiment, the method can further include positioning a third solar cell adjacent to the second solar cell, where a second interconnect is used to connect the third solar cell to the second solar cell, forming a plurality of electrically connected solar cells having a first, second and third solar cell and a first and second interconnect. In yet another embodiment, the method can include any number of solar cells and interconnects to create a solar array of electrically connected solar cells.

Another method for connecting a plurality of solar cells can include positioning a first solar cell adjacent to a second solar cell, each solar cell comprising a plurality of solder pads, where positioning a first solar cell adjacent to a second solar cell includes positioning the solder pads of the first solar cell proximate and perpendicular to the solder pads of the second solar cell. The method can also includes aligning a first interconnect to the first and second solar cells, where the first interconnect has a main body and cantilevered tabs extending downwardly therefrom, and wherein each of the tabs has a downward depression with a height in the range of 10-50 microns centrally located near a tab edge, such that lower surfaces of the tabs are positioned above the upper surface of the solder pads of both the first and second solar cells. The method can further include pinning the first interconnect against a work surface by pressing a hold down pin against the main body of the first interconnect such that the lower surfaces of the interconnect tabs are maintained substantially parallel to the upper surfaces of the solder pads, and such that the depression of each of the tabs substantially flatly contacts one of the solder pads. The method can further include forming a solder paste into a liquid state uniformly spread around the depression between the interconnect tabs and solder pads thereby forming an electrical connection between the first and second solar cells. In some embodiments, forming a solder paste into a liquid state includes forming a solder paste into a liquid state using induction soldering. In other embodiments, the method can further include depositing solder paste on the plurality of solder pads prior to aligning the first interconnect to the first and second solar cells.

Still another method for connecting a plurality of solar cells can include positioning a first solar cell adjacent to a second solar cell, each solar cell having a plurality of solder pads, where positioning a first solar cell adjacent to a second solar cell includes positioning the solder pads of the first solar cell proximate and parallel to the solder pads of the second solar cell. The method can also include aligning a first interconnect to the first and second solar cells, where the first interconnect has a main body and cantilevered tabs extending downwardly therefrom, and where each of the tabs has a downward depression with a height in the range of 10-50 microns centrally located near a tab edge, such that lower surfaces of the tabs are positioned above the upper surface of the solder pads of both the first and second solar cells. The method can also include pinning the first interconnect against a work surface by pressing down against the main body of the first interconnect such that the lower surfaces of the interconnect tabs are maintained substantially parallel to the upper surfaces of the solder pads, and such that the depression of each of the tabs substantially flatly contacts one of the solder pads. The method can further include forming a solder paste into a liquid state uniformly spread around the depression between the interconnect tabs and solder pads thereby forming an electrical connection between the first and second solar cells. In some embodiments, the method can include forming a solder paste into a liquid state including forming a solder paste into a liquid state using hot soldering. In other embodiments, the method can include pre-applying the solder paste on the lower surface of the interconnect tabs prior to aligning the first interconnect to the first and second solar cells.

In some embodiments, a plurality of electrically connected solar cells can include a first solar cell adjacent to a second solar cell, each solar cell having solder pads. The plurality of electrically connected solar cells can also include an interconnect aligned to the first and second solar cells, where the first interconnect has a main body and a plurality of tabs extending from the main body, and where each of the tabs have a downward depression, such that lower surfaces of the tabs are positioned above the upper surface of the solder pads of both the first and second solar cells. In some embodiments, the height of the downward depression can be in the range of 10-50 microns. In other embodiments, the thickness of the tab is in the range of 50-150 microns. In still other embodiments, the width of the tab is in the range of 2-10 millimeters. In yet other embodiments, the length of the tab is in the range of 2-10 millimeters.

In some embodiments, the depression can be a depression selected from the group containing circular depression, oblong depression, triangular depression, square depression, polygon depression, rectangular depression, rounded-edge rectangular depression, dimple depression, partially hollowed depression, stamped out depression and concave depression. In other embodiments, the interconnect tabs can be cantilevered tabs extending downwardly from the main body of the interconnect. In still other embodiments, the plurality tabs extend from a single side of the main body. In yet other embodiments, the solder pads on each solar cell are formed in two rows along two opposite edges, and each row of solder pads corresponds to and is electrically coupled to the positive or negative electrode of the solar cell, and where the solder pads of a first electrode of the first solar cell is proximate to the solder pads of the opposite electrode of the second solar cell.

In some embodiments, the solder pads of the first solar cell are proximate and parallel to the solder pads of the second solar cell. In other embodiments, the solder pads of the first solar cell are proximate and perpendicular to the solder pads of the second solar cell. In still other embodiments, a solder paste can be deposited on the upper surfaces of the solder pads of both first and second solar cells. In yet other embodiments, a solder paste can be pre-applied on the lower surfaces of the interconnect tabs.

In some embodiments, the plurality of solar cells can be a plurality of solar cells selected from the group containing back-contact solar cells, front-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells. In other embodiments, a third solar cell can be connected to the second solar cell, where a second interconnect is used to connect the third solar cell to the second, forming a plurality of electrically connected solar cells having a first, second and third solar cell and a first and second interconnect.

In accordance with yet another embodiment, a plurality of electrically connected solar cells can include a first solar cell adjacent to a second solar cell, each solar cell having solder pads and where the solder pads of the first solar cell are proximate and perpendicular to the solder pads of the second solar cell. The plurality of electrically connected solar cells can include a first interconnect aligned to the first and second solar cells, where the first interconnect has a main body and a plurality of cantilevered tabs extending downwardly from the main body, where each of the tabs include a downward depression with a height in the range of 10-50 microns centrally located near a tab edge, such that lower surfaces of the tabs are positioned above the upper surface of the solder pads of both the first and second solar cells. In some embodiments, a solder paste can be deposited on the upper surfaces of the solder pads of both first and second solar cells. In other embodiments, the plurality of solar cells can be selected from the group containing back-contact solar cells, front-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells.

In accordance with another embodiment, a plurality of electrically connected solar cells can include a first solar cell adjacent to a second solar cell, each of the solar cells having solder pads and where the solder pads of the first solar cell are proximate and parallel to the solder pads of the second solar cell. The plurality of electrically connected solar cells can also include a first interconnect aligned to the first and second solar cells, where the first interconnect includes a main body and a plurality of cantilevered tabs extending downwardly from a single side of the main body, where each of the tabs comprises a downward depression with a height in the range of 10-50 microns centrally located near a tab edge, such that lower surfaces of the tabs are positioned above the upper surface of the solder pads of both the first and second solar cells. In some embodiments, a solder paste can pre-applied on the lower surfaces of the interconnect tabs. In other embodiments, the plurality of solar cells can be selected from the group containing back-contact solar cells, front-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells.

In other embodiments, a method for manufacturing an interconnect can include forming an interconnect having main body and a plurality of tabs using a standard machining process. The method can also include stamping the edges of the interconnect tabs to form downward depressions having an upper surface within a recessed region and a lower surface on an extruding region of the tab. The method can also include applying solder paste to the lower surface of the tabs. In some embodiments, the solder paste can be screen printed onto the lower surface of the depression. In other embodiments, subsequent to the application of solder paste on the lower surface of the depression, the tabs can be bent to form cantilevered tabs extending downwardly from the main body of the first interconnect. In still other embodiments, the depression can be formed into a depression selected from the group containing circular depression, oblong depression, triangular depression, square depression, polygon depression, rectangular depression, rounded-edge rectangular depression, dimple depression, partially hollowed depression, stamped out depression and concave depression.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
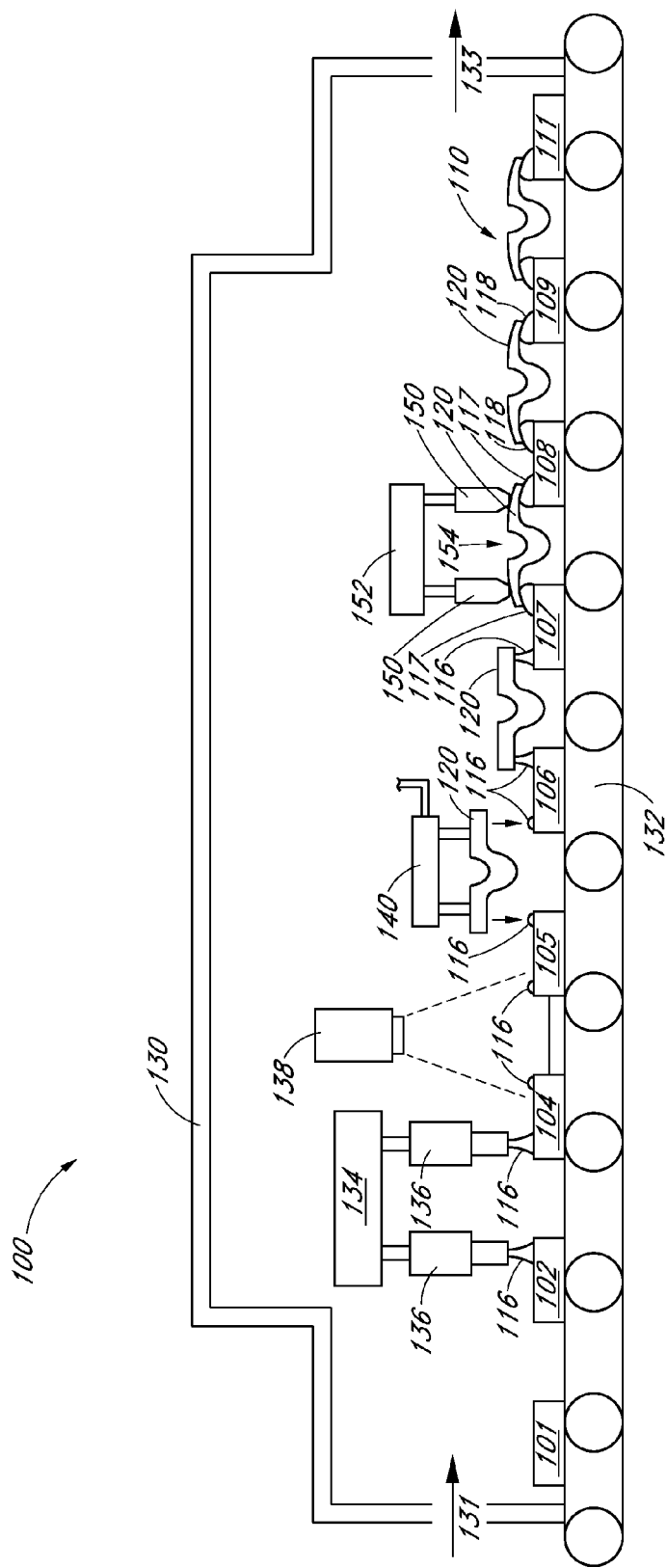
FIG. 1 is a schematic cross-sectional representation of an automatic solar cell stringer used in the standard operation for electrically connecting a plurality of solar cells.
Figure 2:
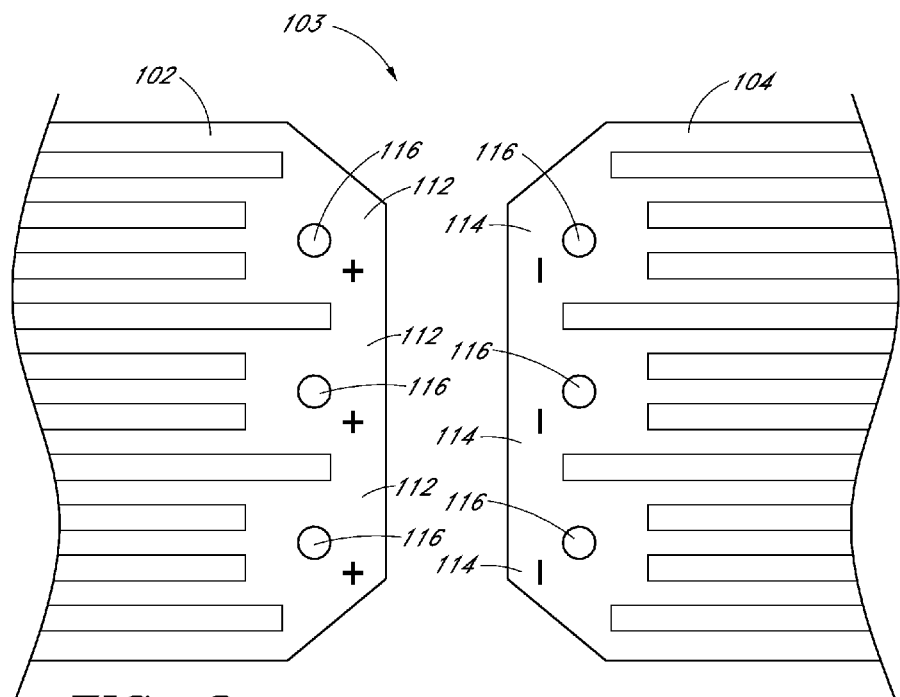
FIG. 2 is an schematic plan view of a plurality of solar cells in accordance with a standard process for electrically connecting a plurality of solar cells.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology can also be used in the following description for the purpose of reference only, and thus is not intended to be limiting. For example, terms such as "upper", "middle", and "lower" refer to directions in the drawings to which reference is made. Terms such as "front" and "back" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import. Similarly, the terms "first", "second", and other such numerical terms referring to structures do not imply a sequence or order unless clearly indicated by the context.

Methods, systems and hardware for connecting solar cells are disclosed below.

FIG. 1 illustrates a known automatic solar cell stringer used in a standard process of electrically connecting a plurality of solar cells. The automatic solar cell stringer 100 can include an enclosure 130 for housing the different equipment required for electrically connecting a plurality of solar cells, a conveyor 132 for loading 131, processing and unloading 133 a plurality of solar cells, a solder paste applicator 134 having dispenser tubes 136 used to dispense a solder paste 116 on a first and second solar cell 102, 104, a vision inspection system 138 for inspecting the solder paste 116 integrity, a robotic arm 140 used to position an interconnect 120 on the solder pads of a third and fourth solar cells 105, 106, and a set of hold down pins 150 for pinning down an interconnect 120 to the solder pads of fifth and sixth solar cells 107, 108, where the hold down pins 150 also include a soldering mechanism 152 to heat the solder paste 116 into a liquid state 117. During operation, and subsequent to a soldering process, the solder paste 117 is allowed to cool down and form a solder joint 118. As a result of processing using the above equipment, a plurality of electrically connected solar cells 110 are formed. The plurality of solar cells 110 can be unloaded 133 from the enclosure 130 by the conveyor 132.

Figure 3:
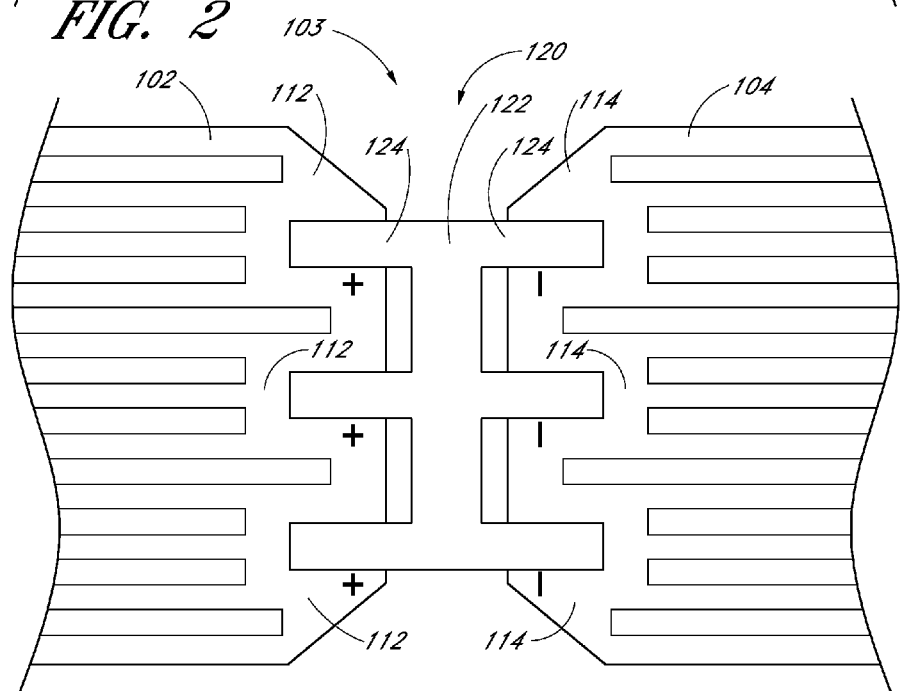
FIGS. 3 and 4 are schematic plan views of the plurality of solar cells of FIG. 2 in accordance with the standard process for electrically connecting a plurality of solar cells.
Figure 4:
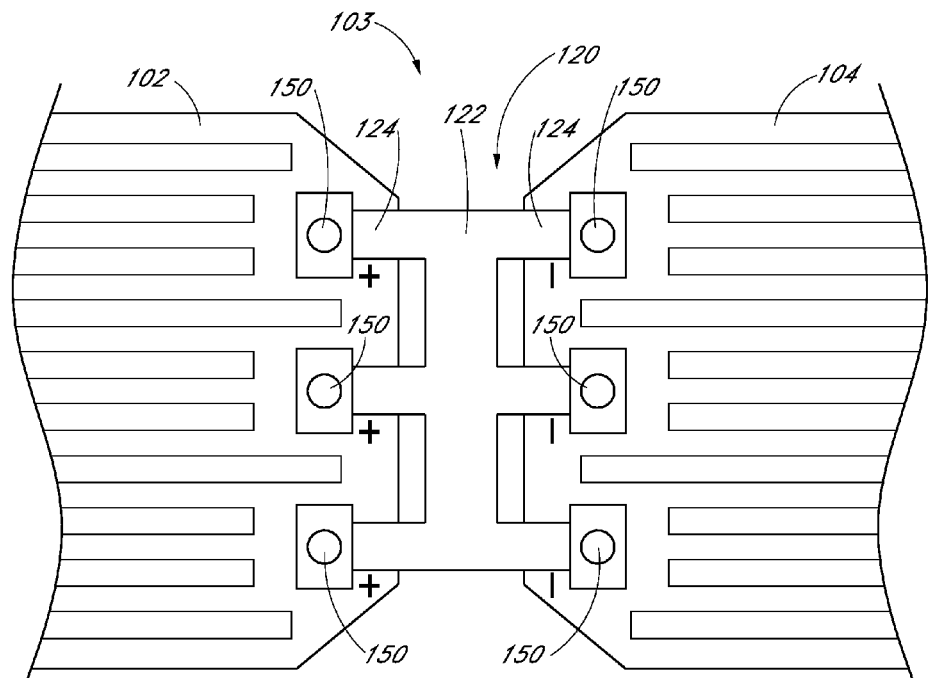
Figure 5:
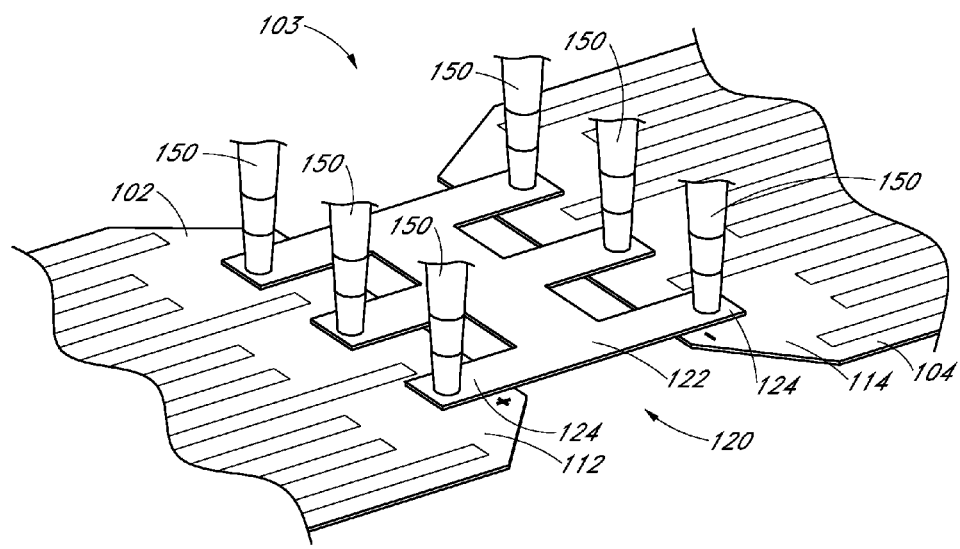
FIG. 5 is a schematic perspective view of the plurality of solar cells of FIG. 4 in accordance with the standard process for electrically connecting a plurality of solar cells.

FIGS. 2-5 illustrate operations in the standard process for electrically connecting a plurality of solar cells. The operation includes positioning a first solar cell 102 adjacent to a second solar cell 104, each solar cell having a plurality of positive solder pads 112 and negative solder pads 114, where each of the solder pads 112, 114 are adapted to receive a solder paste 116. The plurality solar cells 103 can be aligned using a camera and alignment chuck prior to the application of solder paste 116. The operation can also include placing an interconnect 120 in alignment with the solder pads 112, 114 of first and second solar cells 102, 104. The interconnect 120 has a main body 122 and tabs 124 positioned over the solder pads 112, 114 as shown in FIG. 3. The operation can also include positioning a set of hold down pins 150 above the tabs 124 in preparation for applying a contact force on the tabs 124 as shown in FIGS. 4 and 5, where FIG. 5 depicts a schematic perspective view of FIG. 4.

Figure 6:
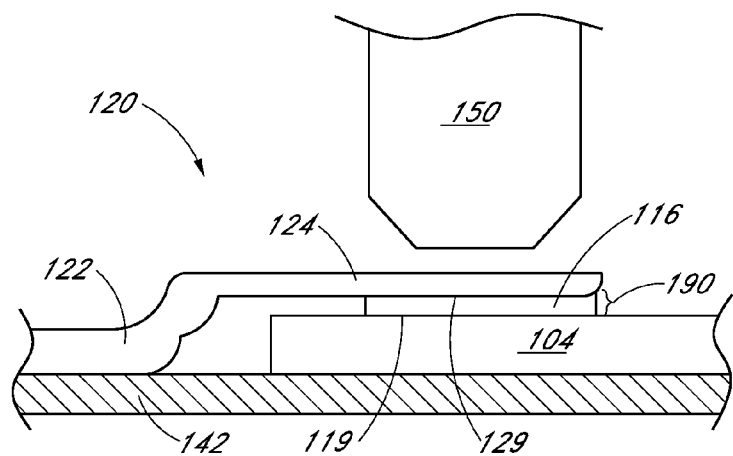
FIGS. 6-8 are schematic cross-sectional representations of an interconnect tab of FIGS. 2-5 in accordance with the standard process for electrically connecting a plurality of solar cells.
Figure 7:
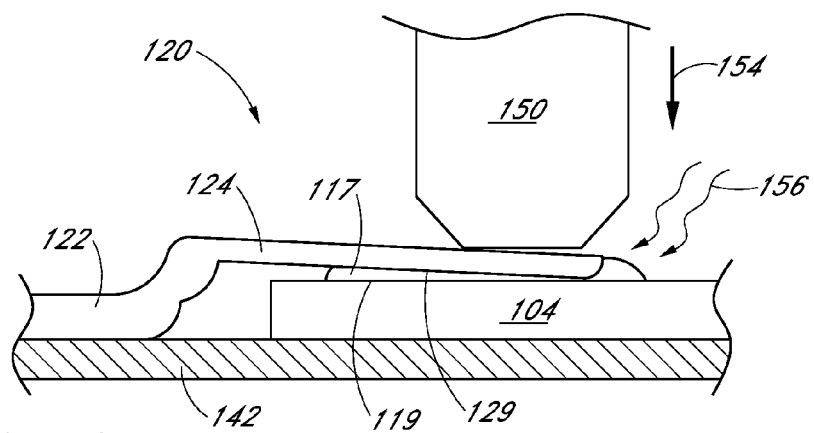
Figure 8:
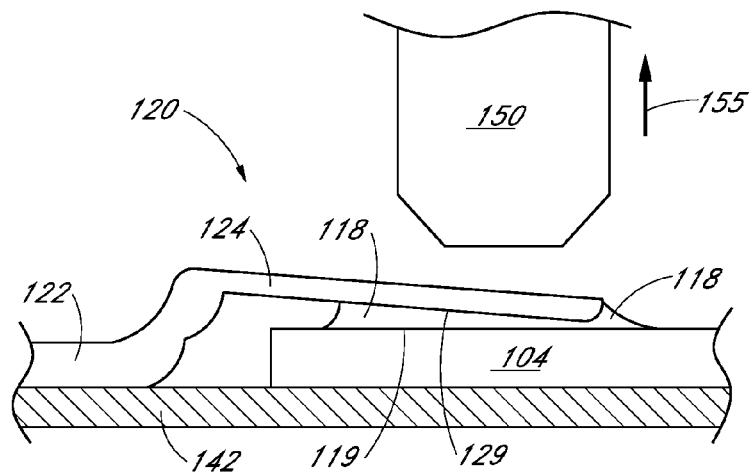

FIGS. 6-8 illustrate cross-sectional representations of an interconnect tab in continuation of the standard process for electrically connecting the plurality of solar cells. For clarity, only a single interconnect tab 120, second solar cell 104, hold down pin 150 and work surface 142 are shown, where the operations discussed below are applicable to all similar structures mentioned above.

The operation can further include aligning a hold down pin 150 over an interconnect tab 124, where the tab 124 has a lower surface 129 positioned over a solder pad upper surface 119 of the second solar cell 104. The solder paste 116 can be disposed between the tab lower surface 129 and solder pad upper surface 119, where a working distance 190 separates the lower surface 129 from the upper surface 119.

The operation can also include lowering the hold down pin in a downward direction 154, pinning the tab lower surface 129 onto the solder pad upper surface 119. The hold down pin 150 can be used to conduct heat 156 onto the solder paste 116 thereby heating the solder paste 116 to a liquid state 117. While the solder paste is in a liquid state 117, the contact force from the hold down pin 150 can further pin the interconnect tab lower surface 129 to the solder pad upper surface 119, where the tab 124 downwardly bends in a wedge contacting the solar cell 104 as seen in FIG. 7.

The operation also includes allowing the solder paste 117 to cool, forming a solder joint 118. In some variations of the standard method of operation, forming the solder paste in a liquid state 117 is performed using standard soldering processes. The contact force from the hold down pin 150 on the interconnect tab 124 is released by raising the hold down pin 150 in an upward direction 155 as shown in FIG. 8.

Figure 9:
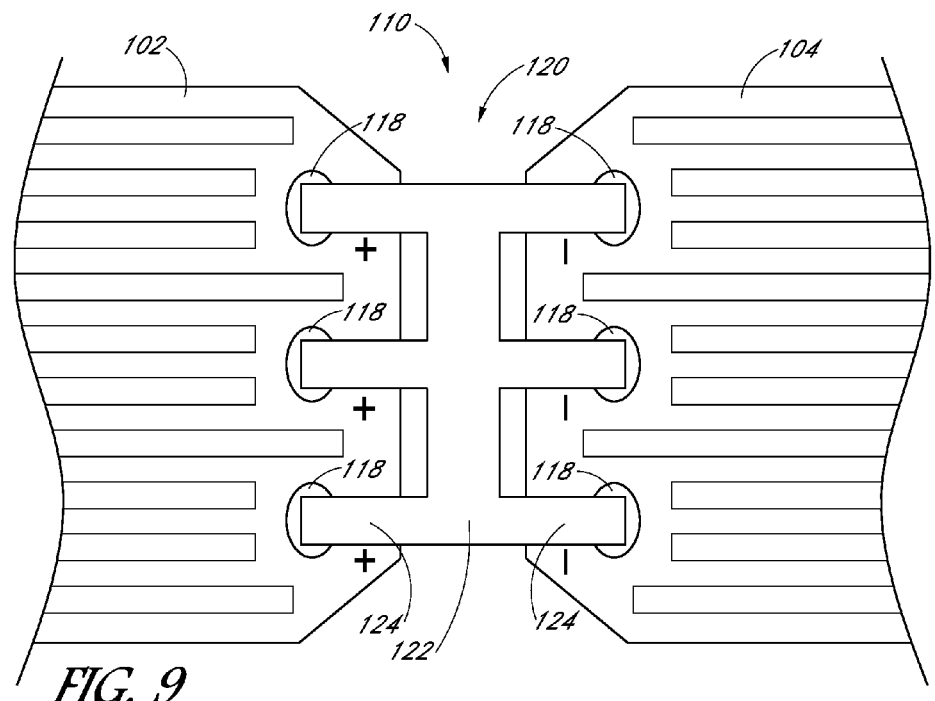
FIG. 9 is an schematic plan view of a plurality electrically connected solar cells subsequent to the operations of FIGS. 2-8 in accordance with the standard process for electrically connecting a plurality of solar cells.

FIG. 9 illustrates a plurality of electrically connected solar cells subsequent to performing the standard processes described in FIGS. 2-8. The plurality of electrically connected solar cells 110 includes a first and second solar cell 102, 104, an interconnect 120 having a main body 122 and tabs 124 electrically connecting both solar cells 102, 104 through solder joints 118.

The standard method of electrically connecting solar cells discussed above forms thin solder joints, and can result in a wedge-shaped solder joint. With reference to FIGS. 7 and 8, the solder paste in a liquid state 117 can flow unevenly between the lower surface 129 of the tab 124 and the upper surface 119 of the solder pad 114 such that the solder joint 118 formed can be a thin solder joint. A thin solder joint can be weak against mechanical strains, can have a short thermal fatigue life and thus be more frequently prone to failure as compared to uniformly formed solder joints. Because solder paste has a relatively low viscosity when molten it normally is not used alone as a structural joint.

It is also challenging for automatic solar cell stringers 100 mentioned above to quickly process and hold parts with repeatable small tolerances in gap and planarity during the standard process mentioned above. Since the hold down pin 150 acts directly on the interconnect tab 124 and over each solder pads 112, 114, slight variation in the hold down pin 150 contact force or alignment can lead to various defects.

If for example, the contact force from the hold down pin 150 is too low, spaces or bubbles in the solder paste 116, 117 may eventually form micro-voids within the solder joint 118. Micro-voids can increase the resistance of a solder joint, decreasing the overall current collected from a solar cell. A contact force that is too high could increase the contact pressure on the solder pads 112, 114 resulting in cracking of the solder pads and damage the solar cell. Alternative techniques include manual alignment between the hold down pin 150, interconnect tab 120 and solder pad 112, 114. For narrower or smaller tabs however, the operator may no longer be able to accurately and repeatedly position the hold down pin to the required tolerance, requiring advanced alignment tools which are more costly.

Since the hold down pin 150 requires fine alignment control, delicate and controlled hold down forces and frequent cleaning of the pin tip, there is a need for improved solution to be used in photovoltaic (PV) module manufacturing. Alternative solutions can include modifying the automation tool to maintain tight alignment, controlled contact force and planarity of parts. This solution can result in a significant bottleneck in throughput and require complex handling mechanisms which would cost additional investment.

Figure 10:
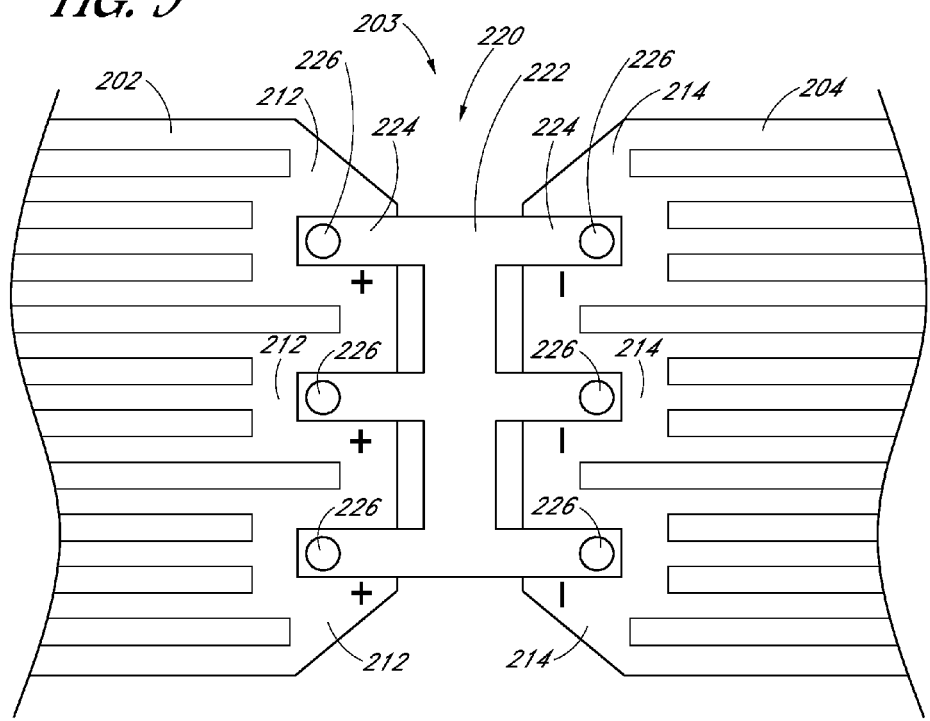
FIGS. 10 and 11 are schematic plan views of a plurality of solar cells in accordance with an embodiment.
Figure 11:
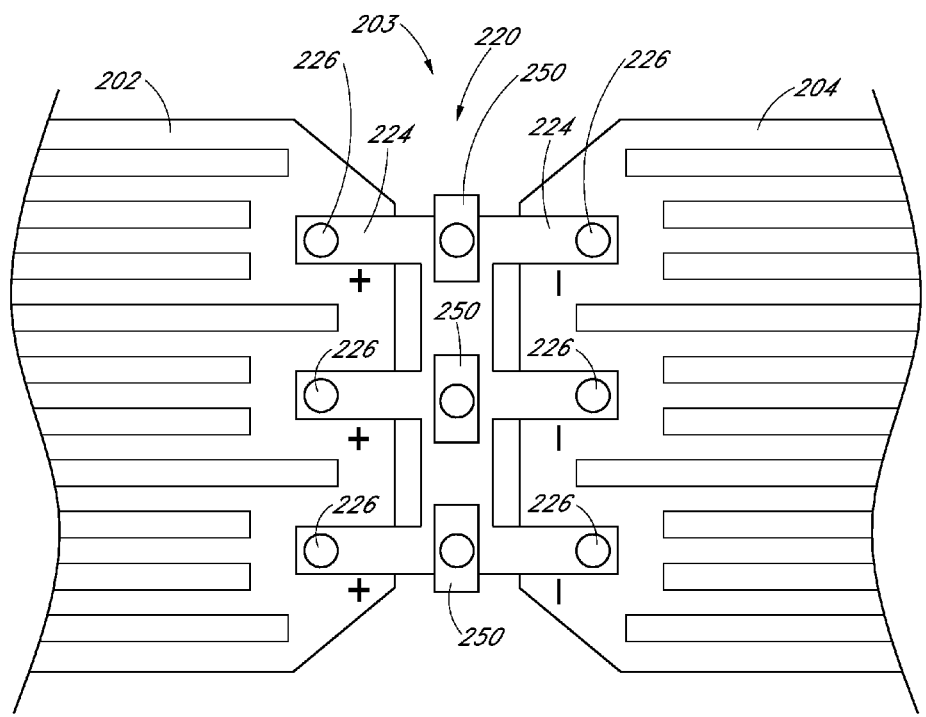
Figure 12:
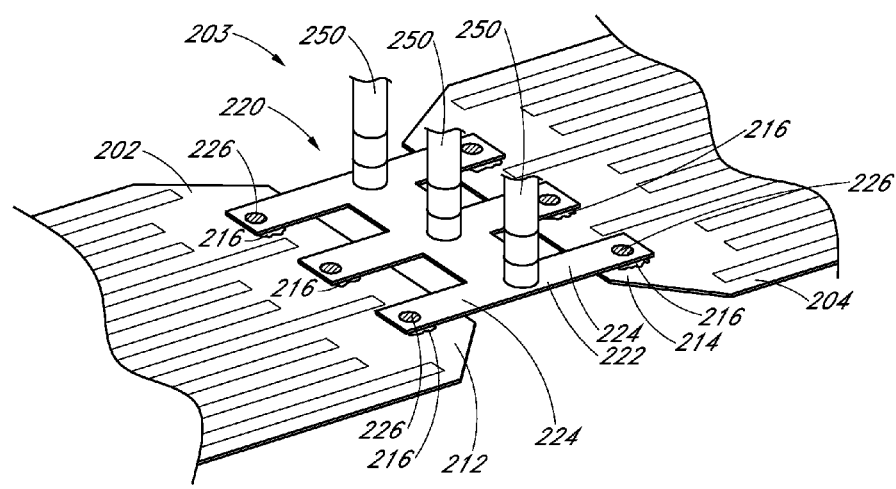
FIG. 12 is a schematic perspective view of the plurality of solar cells of FIG. 11 in accordance with an embodiment.

FIGS. 10-12 illustrate a method of electrically connecting a plurality of solar cells. The method can include positioning a first solar cell 202 adjacent to a second solar cell 204, each solar cell having a plurality of solder pads 212, 214 and positioning the solder pads 212 of the first solar cell 202 proximate and perpendicular to the solder pads 214 of the second solar cell 204. The alignment of the first and second solar cells 202, 204 is similar to that of the alignment of the first and second solar cells 102, 104 in the standard operation of FIG. 2.

The method can also include aligning a first interconnect 220 to the first and second solar cells 202, 204 where the first interconnect 220 has a main body 222 and tabs 224 extending therefrom, and where each of the tabs has a downward depression 226, such that the tabs 224 are positioned above the positive and negative solder pads 212, 214 of both the first and second solar cells 202, 204 as seen in FIG. 10. The method can also include positioning a set of hold down pins 250 above the tabs 224 in preparation to applying a contact force on the interconnect main body 222 as shown in FIGS. 11 and 12, where FIG. 12 depicts a schematic perspective view of FIG. 11.

With reference to FIGS. 13-16, there are shown cross-sectional representations of an interconnect tab in continuation of the method for electrically connecting the plurality of solar cells of FIGS. 10-12. Similar to above, only a single interconnect tab 220, second solar cell 204, hold down pin 250 and work surface 242 are shown, where the operations discussed below are applicable to all similar structures mentioned above.

Figure 13:
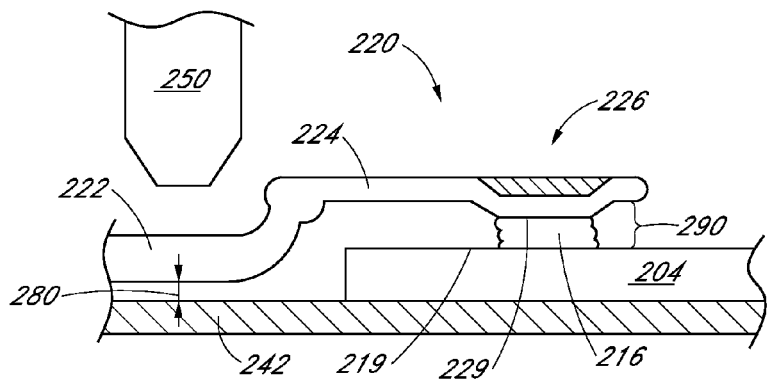
FIGS. 13-16 are schematic cross-sectional representations of an interconnect tab of FIGS. 10-12 in accordance with an embodiment.

The method can further include aligning a hold down pin 250 over the interconnect main body 222, where a an interconnect tab lower surface 229 is positioned parallel to the solder pad upper surface 219 of the solar cell 204 as shown in FIG. 13. In some embodiments, the interconnect tab can be slightly angled such as in FIG. 14, where the interconnect tab is a cantilevered tab 225 extending downwardly from the main body of the first interconnect 220. A first working distance 280, 282 can separate the main body 222 from the work surface 242 and a second working distance 290, 292 can separate the tabs 224, 225 from the solder pad upper surface 219.

Figure 15:
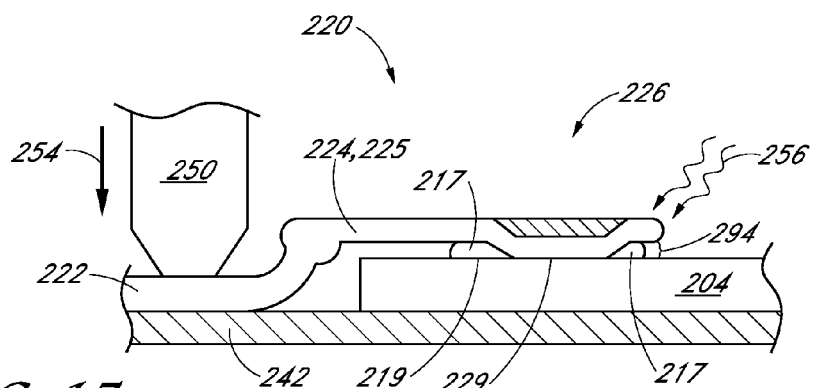

The method can also include pinning the first interconnect 220 against a work surface 242 by lowering the hold down pin 250 in a downward direction 254, pressing the hold down pin 250 against the main body 222 such that the tab lower surface 229 is maintained substantially parallel to the solder pad upper surface 219, and such that the depression 226 substantially flatly contacts the solder pad upper surface 219 as shown in FIG. 15. The method can also includes using the hold down pin 250 to conduct heat 256 to form the solder paste 216 into a liquid state 217.

In some embodiments, the solder paste in a liquid state 217 can be formed using any standard soldering processes such as hot soldering or induction soldering. While the solder paste is in a liquid state 217 the tab 224, 225 can be at a third working distance 294, where the contact force from the hold down pin 250 can further allow the interconnect tab 224, 225 to move downwardly toward the solar cell 204.

As shown in FIG. 15, as the lower surface 229 moves downwardly, the solder paste 217 is squeezed outwardly, thereby forming a thickened area around the periphery of the lower surface 229. Using this process, this thickened area of the solder paste 217 can be largely, substantially, or continuously in contact with the periphery of the much thinner portion of the solder paste 217 disposed directly between the lower surface 229 and the upper surface 219 of the solar cell 204. As such, the resulting thickened solder, after cooling, can provide a source of material to flow into slip planes caused during fatigue-generated deformations, thereby inhibiting crack growth of the thin portion of the cooled solder layer that is directly between the lower surface 229 and the upper surface 219 of the solar cell 204. In embodiments where the recessed portion 226 is round at the lower surface 229, the thickened area of solder paste 217 can be roughly donut-shaped or toroidal. In other embodiments where the lower surface 229 of the resource portion 226 as different shapes, such as square, rectangular, star shaped, the liquid solder paste 217 can flow around the contours associated with such shapes so as to also produce a largely, substantially, or continuously thickened area of solder paste 217 around the corresponding shape of the lower surface 229.

Figure 16:
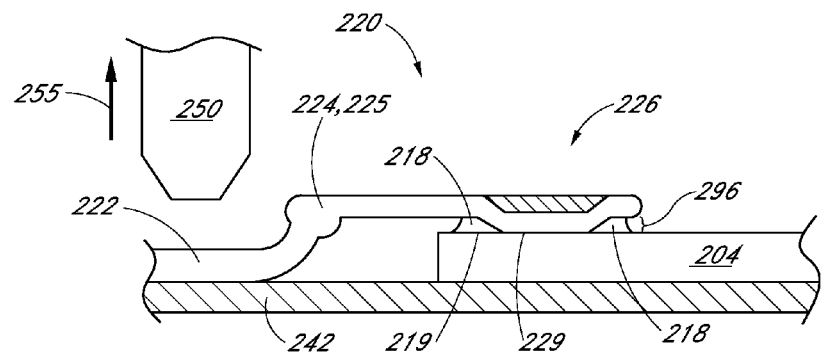

The method can also include allowing the solder paste 217 to cool down, forming a solder joint 218 similar to the above. The method can include releasing the contact force between hold down pin 250 and the interconnect main body 222 by raising the hold down pin 250 in an upward direction 255, where the tab 224, 225 is a fourth working distance 296 away from the solder pad upper surface 219 as shown in FIG. 16.

Figure 14:
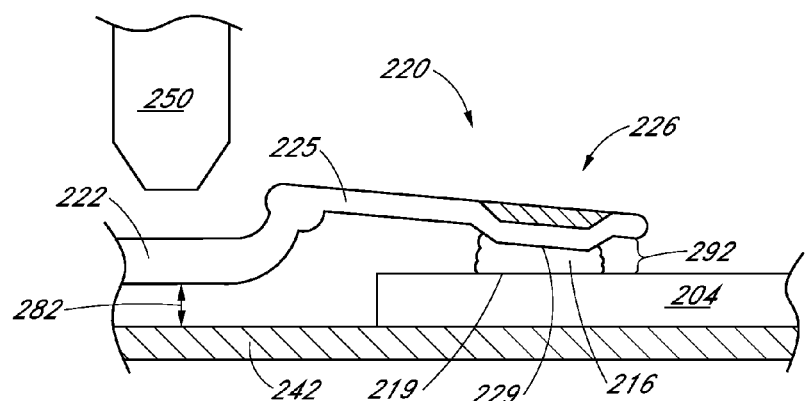

In other embodiments, the interconnect tab 225 of FIG. 14 provides a controlled spring force during the process when the main body 222 of the interconnect 220 is pressed against the work surface 242 by the hold down pin 250 minimizing the third working distance. In still other embodiments, the cantilever tab 225 provides a finer hold down force as compared to the contact force from the hold down pin 150 of the standard method mentioned above, preventing cracking of the solder pad and damage to the solar cell 204. In yet other embodiments, reducing the size of the cantilever tab 225 can provide flexibility against contact stress on the solder pad upper surface 219 also preventing solar cell cracking. In other embodiments, pinning the hold down pin 250 against the main body 222 of the interconnect 220 allows for a contact force in the range of 0-1.0 Newtons between the tab lower surface 229 and the solder pad upper surface 219. In still other embodiments, the depth of the downward depression 226 defines the solder meniscus, where the downward depression 226 controls the solder flux spread.

Figure 17:
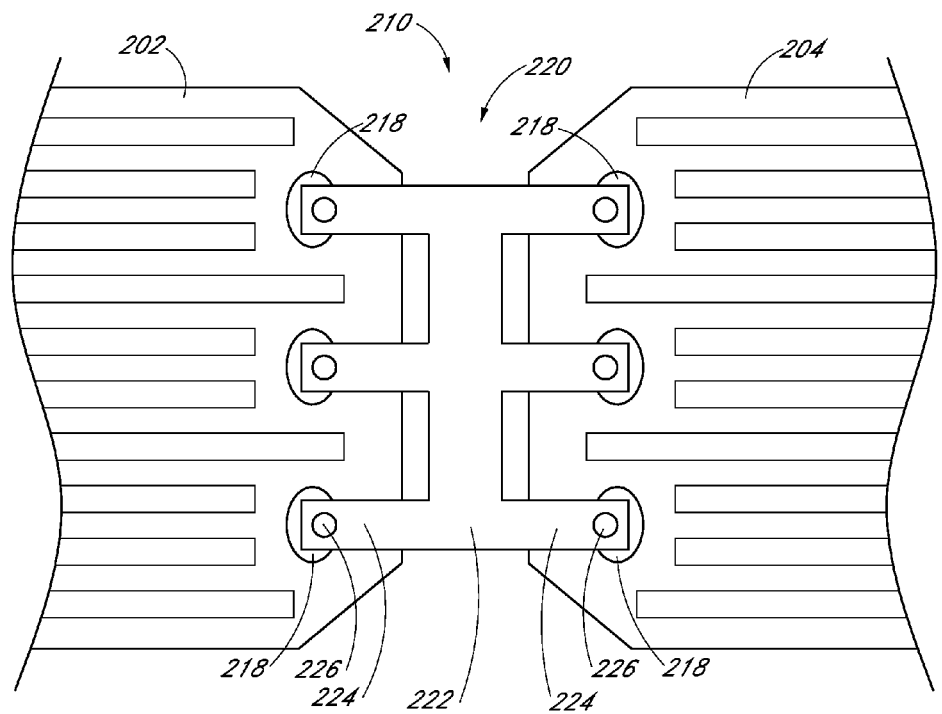
FIG. 17 a schematic plan view of a plurality electrically connected solar cells subsequent to the operations of FIGS. 10-16 in accordance with an embodiment.

FIG. 17 illustrates a schematic perspective view of a plurality of electrically connected solar cells subsequent to performing the method of FIGS. 10-16. The plurality of electrically connected solar cells 210 includes a first and second solar cell 202, 204, an interconnect 220 having a main body 222 and tabs 224 electrically connecting both solar cells 202, 204 through solder joints 218. In another embodiment, electrically connecting a plurality of solar cells 210 includes electrically connecting a plurality of solar cells 210 selected from the group containing back-contact solar cells, front-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells.

Figure 18:
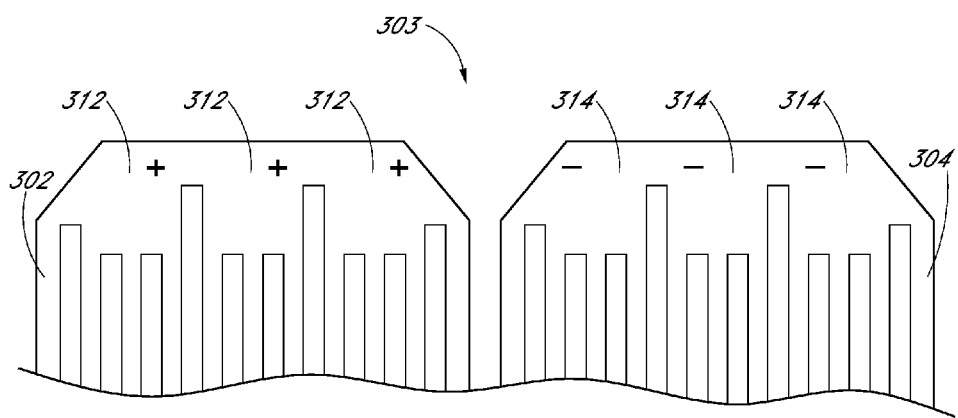
FIG. 18 is a schematic plan view of a plurality of solar cells in accordance with another embodiment of the present inventions.
Figure 19:
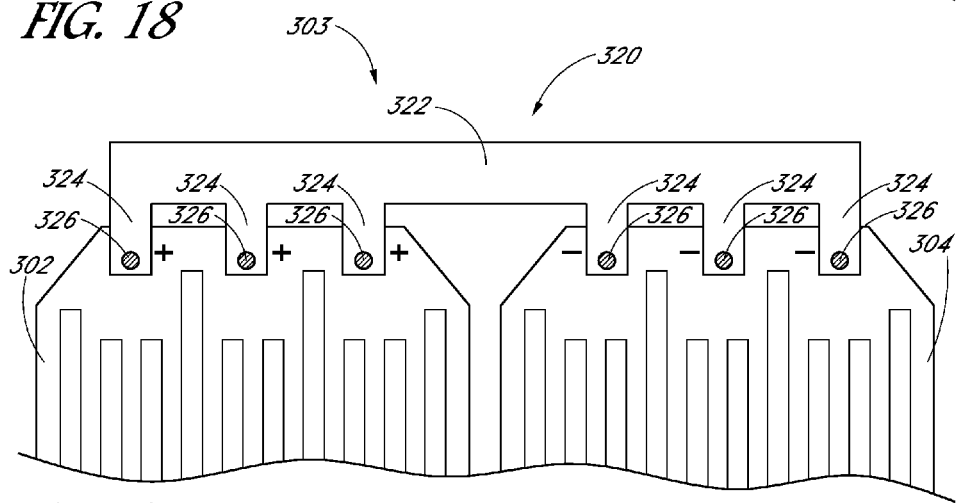
FIGS. 19 and 20 are schematic plan views of the plurality of solar cells of FIG. 18 in accordance with another embodiment of the present inventions.
Figure 20:
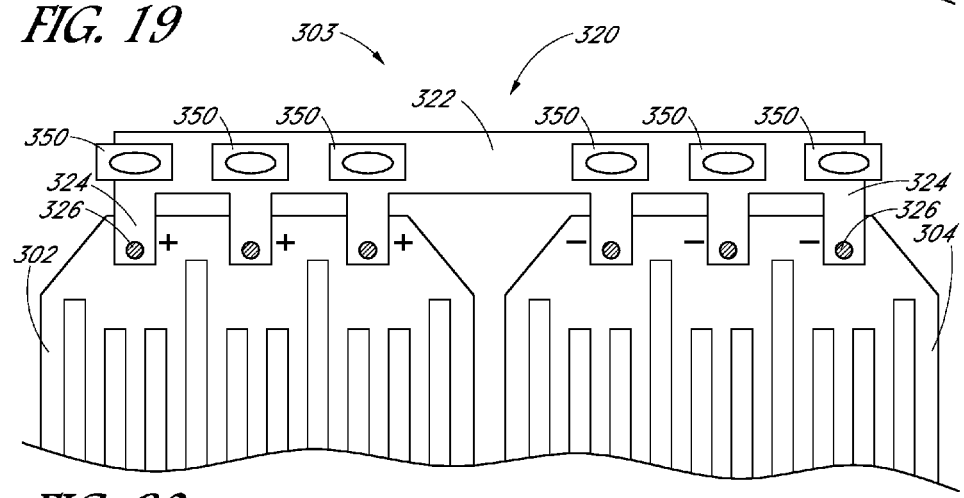
Figure 21:
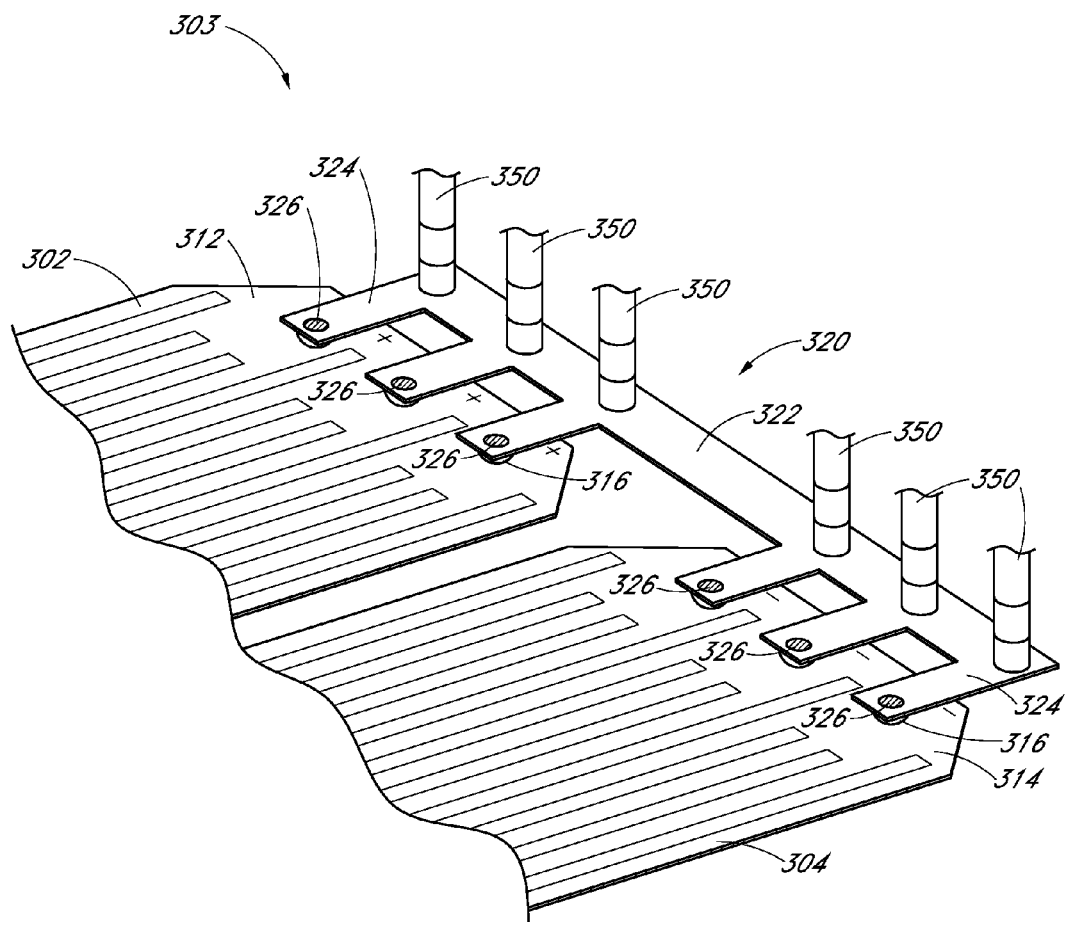
FIG. 21 is a schematic perspective view of the plurality of solar cells of FIG. 20 in accordance with another embodiment of the present inventions.

With reference to FIGS. 18-21, there are shown additional methods of electrically connecting a plurality of solar cells. Some embodiments of these methods can include positioning a first solar cell 302 adjacent to a second solar cell 304, each solar cell having a plurality of positive and negative solder pads 312, 214. The method can also include positioning the solder pads 312 of the first solar cell 302 proximate and parallel to the solder pads 314 of the second solar cell 304. In some embodiments, the plurality solar cells 303 can be aligned using a camera and alignment chuck prior to application of solder paste 316. The method can also include aligning a first interconnect 320 to the first and second solar cells 302, 304, where the first interconnect has a main body 322 and cantilevered tabs 324, each of the tabs 324 having a downward depression 326 centrally located near a tab edge as seen in FIG. 19. The method can further include positioning a set of hold down pins 350 above the main body 322 in preparation to applying a contact force on the main body 322 as shown in FIGS. 20 and 21, where FIG. 21 depicts a schematic perspective view of FIG. 20.

Figure 22:
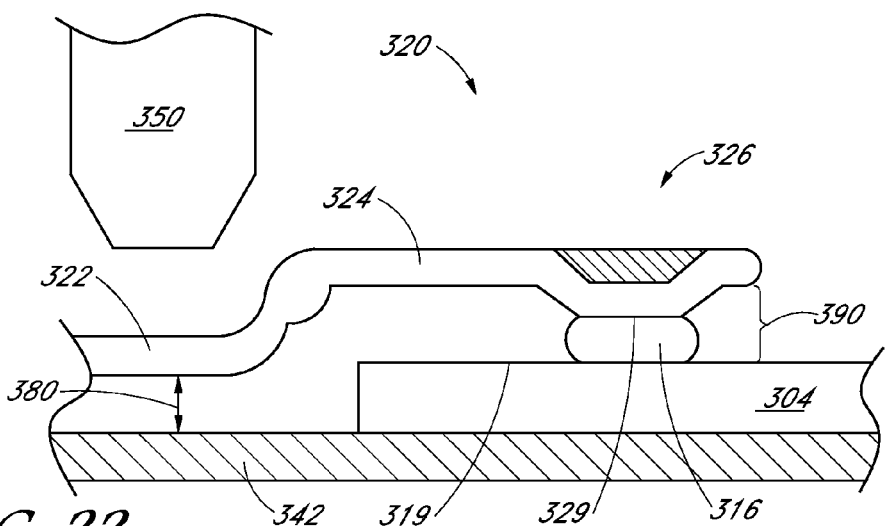
FIGS. 22-25 are schematic cross-sectional representations of an interconnect tab of FIGS. 18-21 in accordance with another embodiment.

FIGS. 22-25 illustrate cross-sectional representations of an interconnect tab in continuation to the method of electrically connecting solar cells of FIGS. 18-21. Similar to above, only a single interconnect tab 320, second solar cell 304, hold down pin 350 and work surface 342 are shown, where the operations discussed below are applicable to all similar structures mentioned above. The method can further include aligning a hold down pin 350 over the interconnect main body 322, where an interconnect tab lower surface 329 is positioned parallel to a solder pad upper surface 319 as shown in FIG. 22. In some embodiments, the interconnect tab can be slightly angled such as in FIG. 23, where the interconnect tab is a cantilevered tab 325 extending downwardly from the main body of the first interconnect 320. As discussed above, a first working distance 380, 382 can separate the main body 322 from the work surface 342 and a second working distance 390, 392 can separate the tabs 324, 325 from the solder pad upper surface 319.

Figure 24:
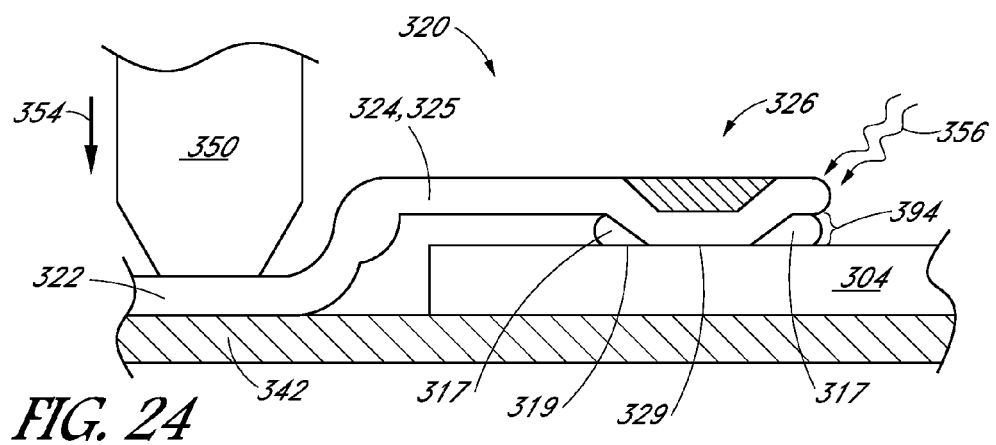

The method can also include pinning the first interconnect 320 against a work surface 342 by lowering the hold down pin 350 in a downward direction 354, pressing the hold down pin 350 against the main body 322 such that the tab lower surface 329 is maintained substantially parallel to the solder pad upper surface 319, and such that the depression 326 substantially flatly contacts the solder pad upper surface 219 as shown in FIG. 24. The method can also include using the hold down pin 350 to conduct heat 356 to melt a pre-formed solder paste 316 into a liquid state 317.

Figure 25:
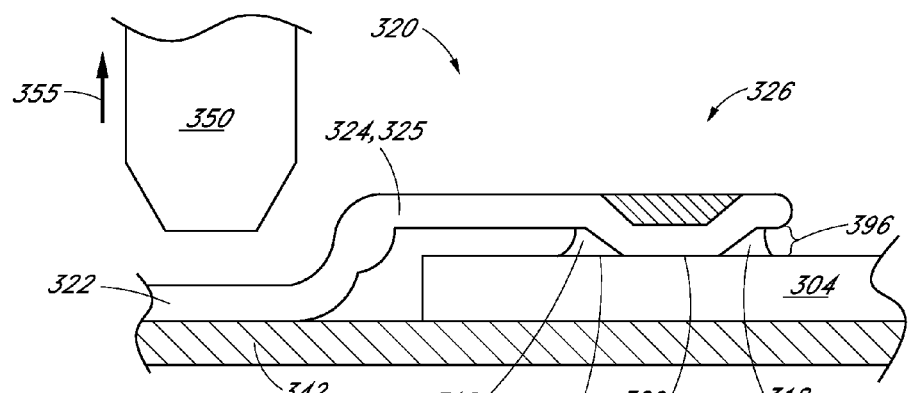

In some embodiments similar to the above, the solder paste in a liquid state 317 can be formed using any standard soldering processes such as hot soldering or induction soldering. While the solder paste is in a liquid state 317 the tab 224, 225 can be at a third working distance 394, where the contact force from the hold down pin 350 can further allow downward depression 326 to come into contact with the solder cell 204. The method can also include allowing the solder paste 317 to cool down, forming a solder joint 318. The method can also include releasing the contact force between hold down pin 350 and the interconnect main body 322 by raising the hold down pin 350 in an upward direction 355, where the tab 324, 325 is a fourth working distance 396 away from the solder pad upper surface 319 as shown in FIG. 25.

Figure 23:
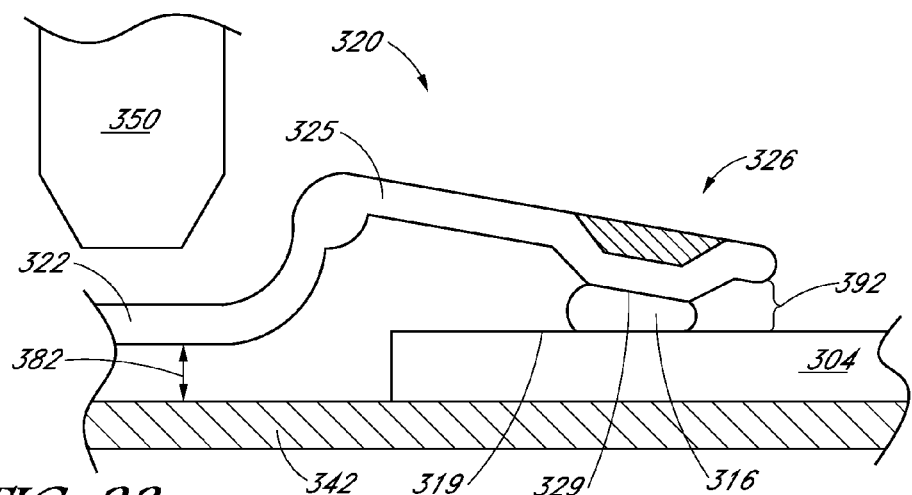

In some embodiments, the interconnect tab 325 of FIG. 23 provides a controlled spring force during the process when the main body 322 of the interconnect 320 is pressed against the work surface 342 by the hold down pin 250 minimizing for the third working distance 394 similar to above. In still other embodiments, the cantilever tab 325 provides a finer hold down force as compared to the contact force from the hold down pin 150 of the standard method mentioned above, preventing cracking of the solder pad and damage to the solar cell 304. In yet other embodiments, reducing the size of the cantilever tab 325 can provide flexibility against contact stress on the solder pad upper surface 319 also preventing solar cell cracking. In other embodiments, pinning the hold down pin 350 against the main body 322 of the interconnect 320 allows for a contact force in the range of 0-1.0 Newtons between the tab lower surface 329 and the solder pad upper surface 319. In still other embodiments, the depth of the downward depression 326 defines the solder meniscus, where the downward depression 326 controls the solder flux spread.

Figure 26:
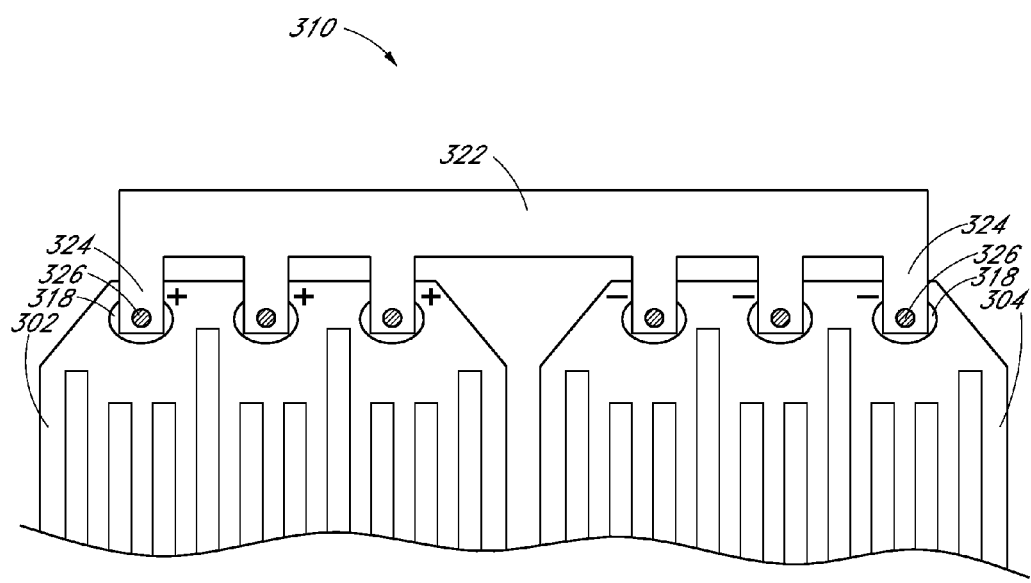
FIG. 26 is a schematic plan view of a plurality electrically connected solar cells subsequent to the operations of FIGS. 18-25 in accordance with another embodiment.

FIG. 26 illustrates a schematic perspective view of a plurality of electrically connected solar cells subsequent to performing the method of FIGS. 18-25. The plurality of electrically connected solar cells 310 can include a first and second solar cell 302, 304, an interconnect 320 having a main body 322 and tabs 324 electrically connecting both solar cells 302, 304 through solder joints 318. In other embodiments, connecting a plurality of solar cells 310 includes connecting a plurality of solar cells 310 selected from the group containing back-contact solar cells, front-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells.

Figure 27:
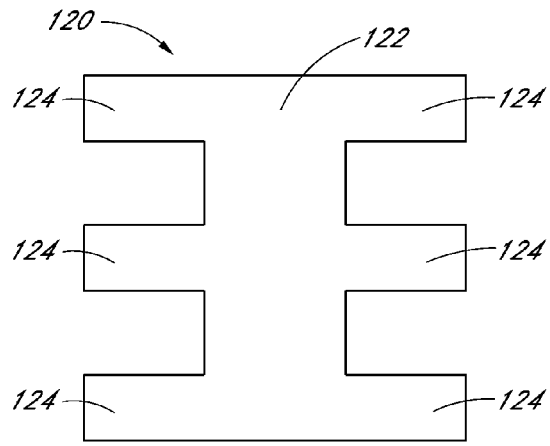
FIG. 27 is a schematic perspective view of an interconnect in accordance with a standard process for electrically connecting a plurality of solar cells.
Figure 28:
FIG. 28 is a schematic cross-sectional representations of the interconnect of FIG. 27 in accordance with the standard process for electrically connecting a plurality of solar cells.

With reference to FIGS. 27 and 28, there are shown an interconnect used in the standard process of electrically connecting a plurality of solar cells. The interconnect 120 can include a main body 122 and a plurality of tabs 124.

Figure 29:
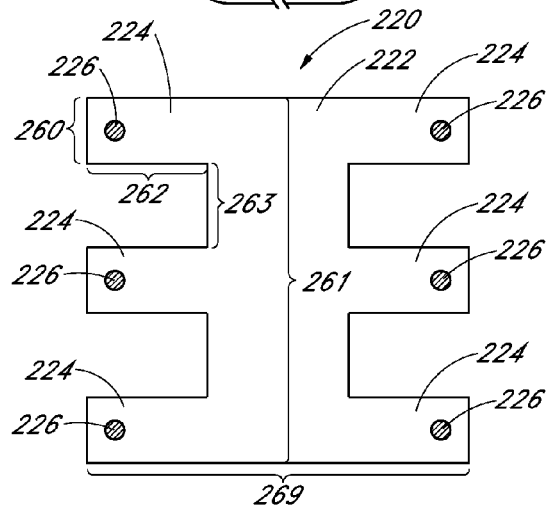
FIG. 29 is a schematic perspective view of an interconnect for electrically connecting a plurality of solar cells in accordance with an embodiment.

FIG. 29 illustrates an interconnect used in the method of electrically connecting a plurality of solar cells of FIGS. 2-17. In some embodiments, the interconnect can have a length 261 in the range of 50-200 millimeters and a width 269 in the range of 5-20 millimeters. In other embodiments, the interconnect can be made of a metal selected from the group containing copper, silver, gold and aluminum. In an embodiment, the interconnect can have a thin coating of nickel or tin. The interconnect 220 includes a main body 222 and a plurality of tabs 224 extending from the main body, and where each of the tabs have a downward depression 226. In an embodiment, the width 260 of the tabs 224 can be in the range of 2-10 millimeters and the length 262 of the tab can be in the range of 2-10 millimeters. In other embodiments, the distance between tabs 263 can be in the range of 5-50 millimeters.

Figure 30:
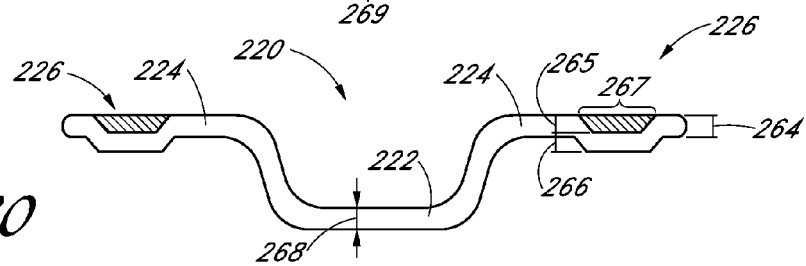
FIGS. 30 and 31 are schematic cross-sectional representations of the interconnect of FIG. 29 in accordance with an embodiment.
Figure 31:
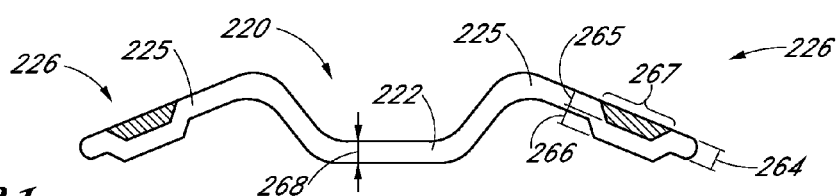

With reference to FIGS. 30 and 31, there are shown cross-sectional representations of the interconnect tab of FIG. 29. FIG. 30 shows the interconnect 220 with a tab 224 in accordance with the embodiment of FIG. 13 and FIG. 31 shows the interconnect 220 with a tab 225 in accordance with the embodiment of FIG. 14. In some embodiments, the interconnect can have a thickness 268 in the range of 50-150 microns and the interconnect tab can have a thickness 264 in the range of 50-150 microns. In other embodiments, the width 267 of the depression can be in the range of 2-10 millimeters. In still other embodiments, the depression can have an upper cavity thickness 265 in the range of 10-50 microns and a lower thickness 266 in the range of 10-50 microns.

Figure 32:
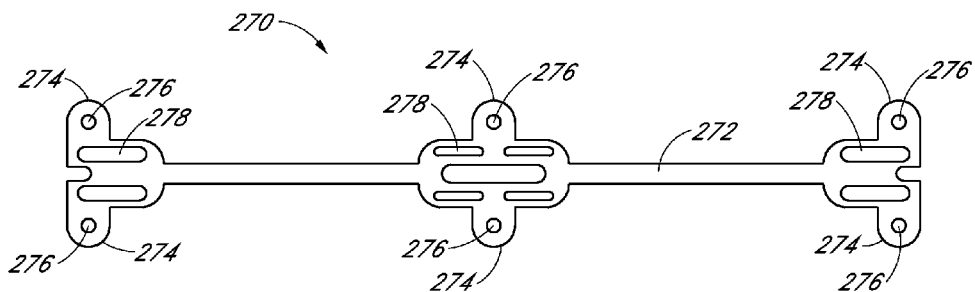
FIG. 32 is a schematic plan view of an interconnect for electrically connecting solar cells in accordance with another embodiment.

FIG. 32 illustrates an embodiment of the interconnect from FIGS. 29-31. The interconnect 270 can have a main body 272, tabs 274, downward depressions 276 and relief features 278. In some environments, the interconnect 270 can be an interconnect used in electrically connecting solar cells manufactured by SunPower Corporation©. In other embodiments, the interconnect 270 can be used in electrically connecting plurality of solar cells selected from the group containing a back-contact solar cells, front-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells.

Figure 33:
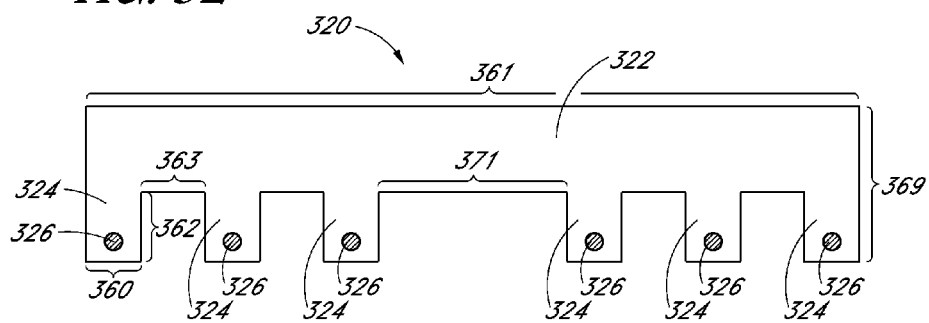
FIG. 33 is a schematic plan view of an interconnect for electrically connecting solar cells in accordance with still another embodiment.

With reference to FIG. 33, there is shown an interconnect used in the method of electrically connecting a plurality of solar cells of FIG. 18—In an embodiment, the interconnect 320 can have a length 361 in the range of 50-200 millimeters and a width 369 in the range of 8-20 millimeters. In other embodiments, the interconnect 320 can be made of a metal selected from the group containing copper, silver, gold and aluminum. In an embodiment, the interconnect can have a thin coating of nickel or tin. The interconnect 320 includes a main body 322 and a plurality of tabs 324 extending from the main body 322, and where each of the tabs 324 have a downward depression 326.

In some embodiments, the width 360 of the tabs 324 can be in the range of 2-10 millimeters and the length 362 of the tab can be in the range of 2-10 millimeters. In other embodiments, the distance between tabs 363 can be in the range of 5-50 millimeters.

Figure 34:
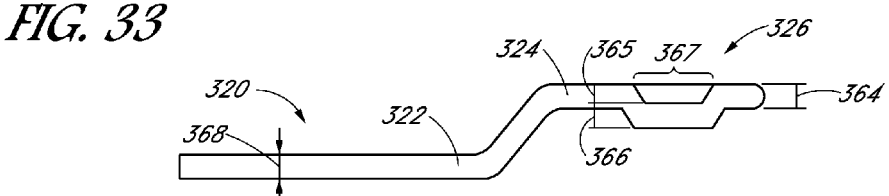
FIGS. 34 and 35 are schematic cross-sectional representations of the interconnect of FIG. 33 in accordance with still another embodiment.
Figure 35:
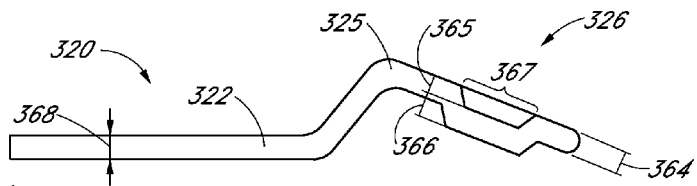

With reference to FIGS. 34 and 35, there are shown cross-sectional representations of the interconnect tab of FIG. 33. FIG. 30 shows the interconnect 320 with a tab 324 in accordance with the embodiment of FIG. 22 and FIG. 23 shows the interconnect 320 with a tab 325 in accordance with the embodiment of FIG. 14. In some embodiments the interconnect 320 can have a thickness 368 in the range of 50-150 microns and the interconnect 320 tab 324 can have a thickness 364 in the range of 50-150 microns. In other embodiments, the width 367 of the depression 326 can be in the range of 2-10 millimeters. In still other embodiments, the depression 326 can have an upper cavity thickness 365 in the range of 10-50 microns and a lower thickness 366 in the range of 10-50 microns.

Figure 36:
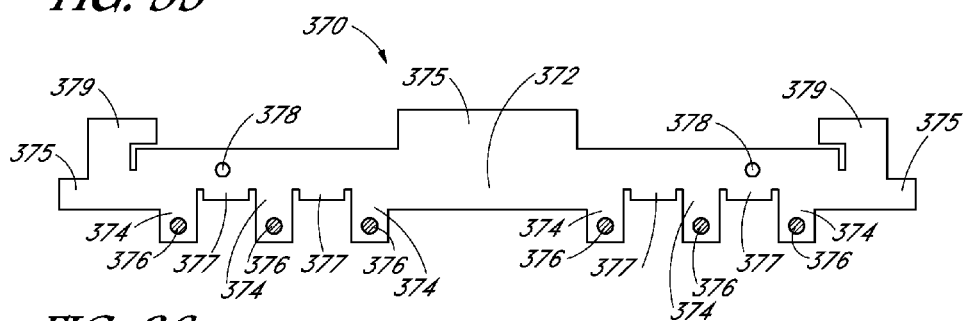
FIG. 36 is a schematic plan view of an interconnect for electrically connecting solar cells in accordance with yet another embodiment.

FIG. 36 illustrates an embodiment of the interconnect from FIGS. 33-35. The interconnect 370 can have a main body 372, tabs 374, 379, extruding features 375, downward depressions 376, relief features 377 and alignment features 378. In some embodiments, the interconnect 370 can be an interconnect used in electrically connecting solar cells manufactured by SunPower Corporation©. In other embodiments, the interconnect 370 can be used in electrically connecting plurality of solar cells selected from the group containing a back-contact solar cells, front-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells.

Figure 37:
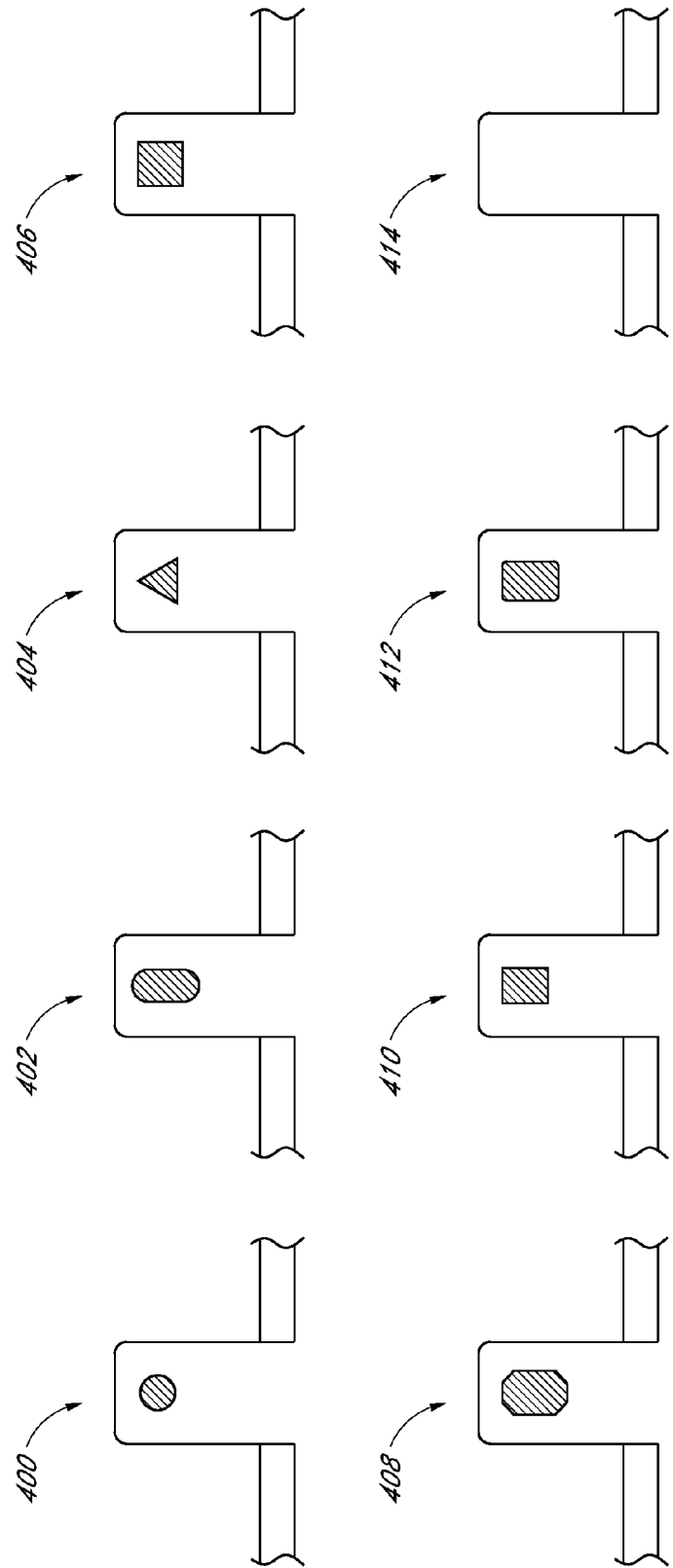
FIG. 37 is a schematic perspective view of different interconnect tabs for electrically connecting solar cells in accordance with an embodiment.

FIG. 37 illustrates a schematic perspective view in accordance with an embodiment of the inventions discussed above. In some embodiments, the downward depression 226, 326 can be a circular depression 400, oblong depression 402, triangular depression 404, square depression 406, polygon depression 408, rectangular depression 410, and rounded-edge rectangular depression 412. In other embodiments the tabs 224, 324 may have instead an extrusion 414 on the lower surface of the tabs 224, 324 as also seen below in 434 of FIG. 38.

Figure 38:
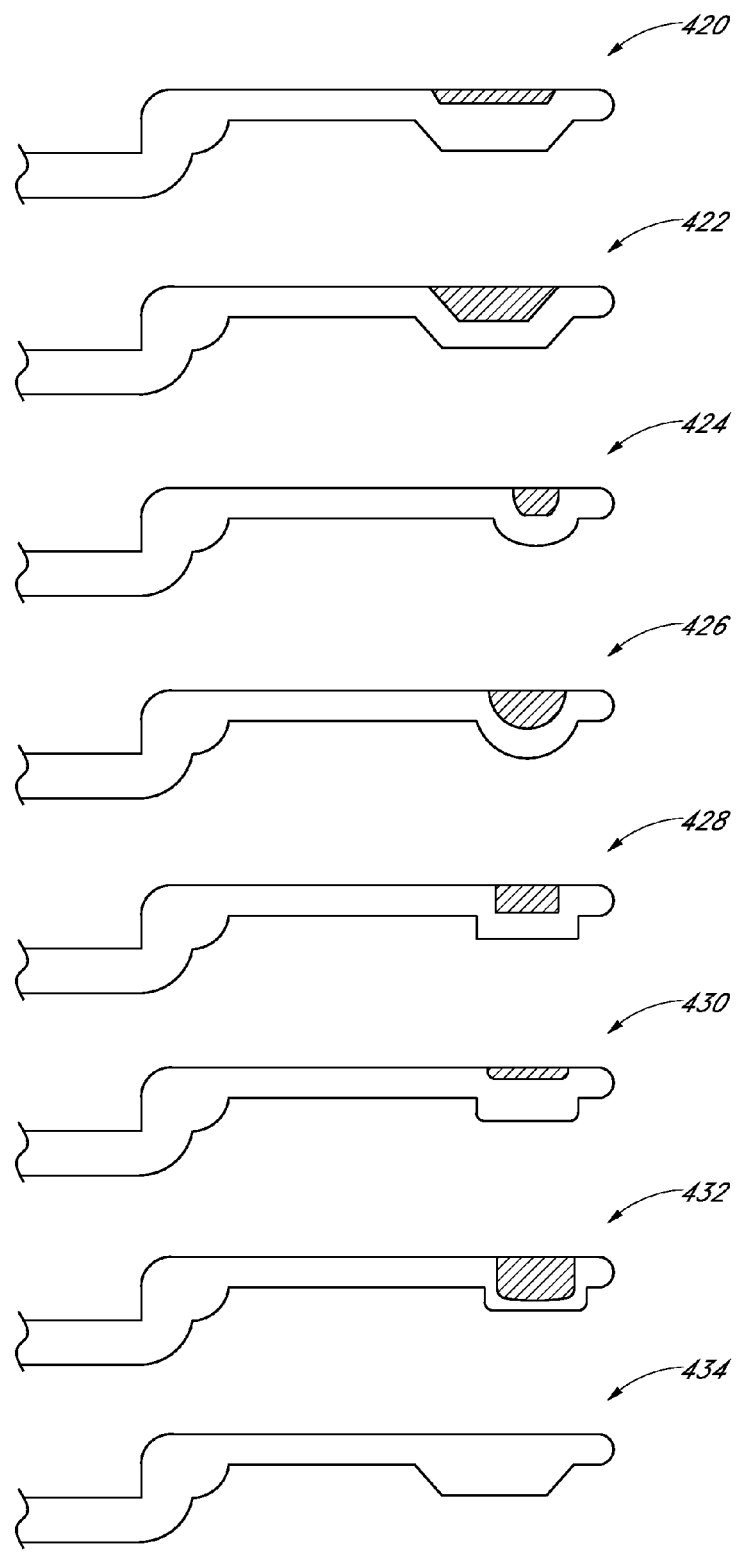
FIG. 38 is a cross-sectional representation of different interconnect tabs for electrically connecting solar cells in accordance with an embodiment.

With reference to FIG. 38, there are shown a cross-sectional representation of the plurality of downward depressions of FIG. 37. In some embodiments, the downward depression 226, 326 can be a partially hollowed depression 420, regularly hollowed depression 422, dimple depression 424, concave depression 426, square or rectangular depression 428, partially hollowed rounded-edge rectangular depression 430, and rounded-edge rectangular depression 432. In other embodiments the tabs 224, 324 may have instead an extrusion 434 on the lower surface of the tabs 224, 324.

Figure 39:
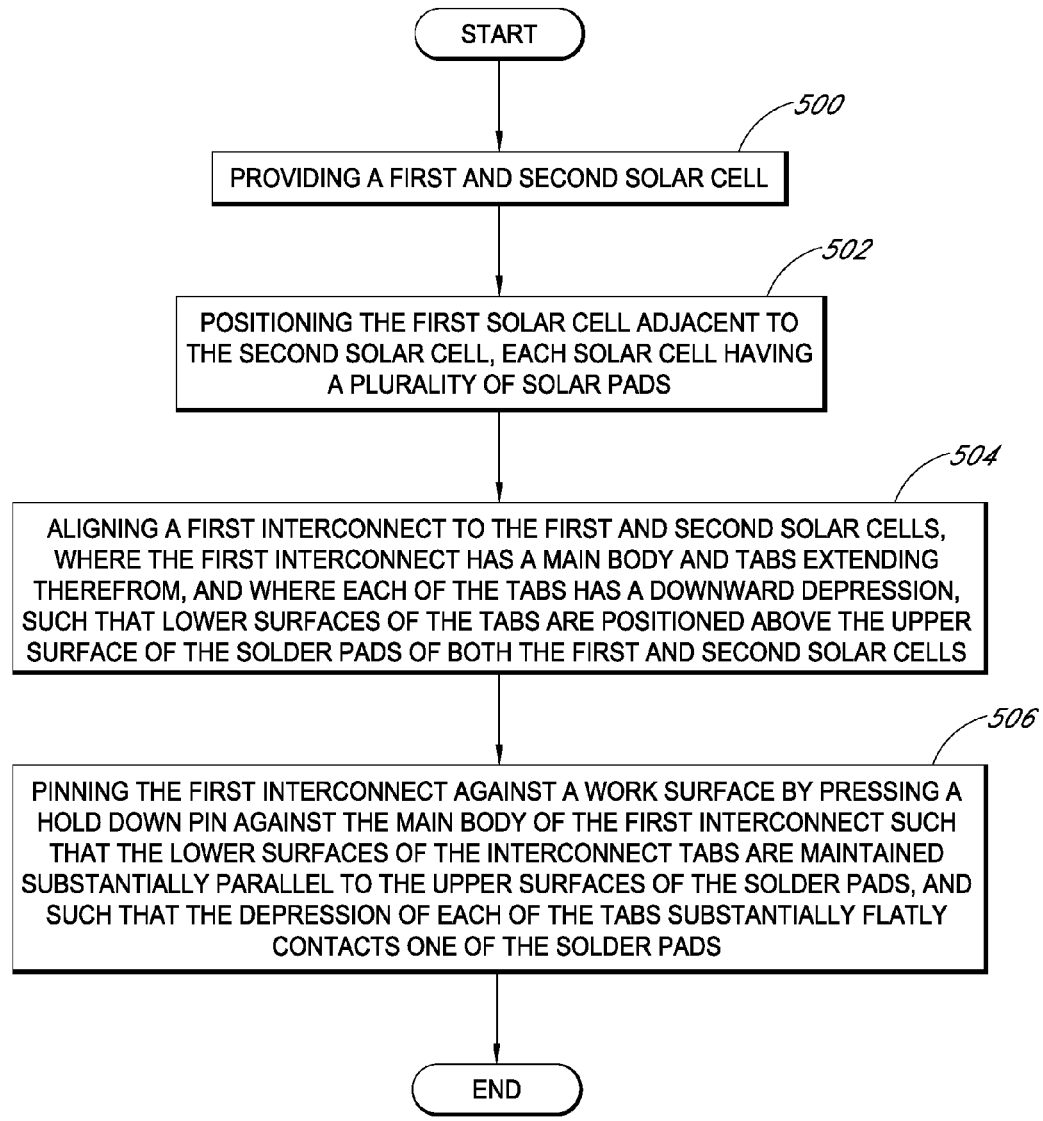
FIGS. 39-42 are flowcharts illustrating methods of electrically connecting solar cells in accordance with an embodiment.

FIG. 39 illustrates a flow chart of an embodiment of a method for electrically connecting a plurality of solar cells. As described above, the first operation 500 can include providing first and second solar cell 202, 204. The second operation 502 can include positioning the first solar cell 202 adjacent to the second solar cell 204, each solar cell having a plurality of solder pads 212, 214. The third operation 504 can include aligning a first interconnect 220 to the first and second solar cells 202, 204, where the first interconnect 220 has a main body 222 and tabs 224 extending therefrom, and where each of the tabs 224 has a downward depression 226, such that lower surfaces 229 of the tabs 224 are positioned above the upper surface 219 of the solder pads 212, 214 of both the first and second solar cells 202, 204. The last operation 506 can include pinning the first interconnect 220 against a work surface 242 by pressing a hold down pin 250 against the main body 222 of the first interconnect 220 such that the lower surfaces 229 of the interconnect tabs 224 are maintained substantially parallel to the upper surfaces 219 of the solder pads 212, 214, and such that the depression 226 of each of the tabs 224 substantially flatly contacts one of the solder pads 212, 214. In some embodiments, the last operation 506 can include pressing down the main body 222 with sufficient force to cause liquid solder to flow outwardly from the lower surface of the depression 226 toward a periphery of the depression 226 and so as to collect in a second layer of solder around the periphery of the lower surface of the depression 226.

Figure 40:
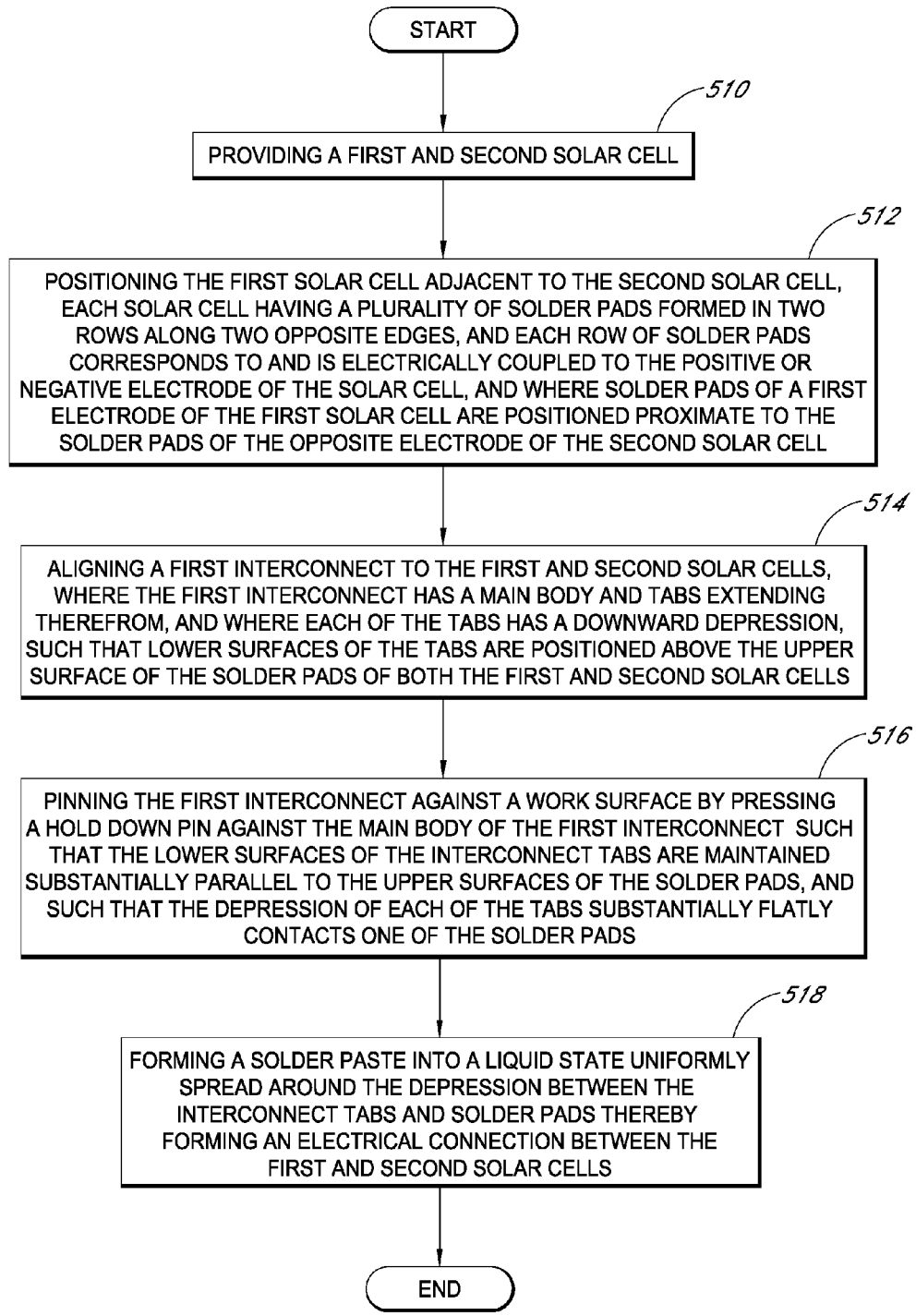

With reference to FIG. 40, there is shown a flow chart of another embodiment for electrically connecting a plurality of solar cells. The first operation 510 can include providing a first and second solar cell 202, 204. The second operation 512 can include positioning the first solar cell 202 adjacent to the second solar cell 204, each solar cell having a plurality of solder pads 212, 214 formed in two rows along two opposite edges, and each row of solder pads 212. 214 corresponds to and is electrically coupled to the positive or negative electrode of the solar cell 202, 204, and where solder pads 212 of a first electrode of the first solar cell 202 are positioned proximate to the solder pads 214 of the opposite electrode of the second solar cell 204. The third operation 514 can include aligning a first interconnect 220 to the first and second solar cells 202, 204, where the first interconnect 220 has a main body 222 and tabs 224 extending therefrom, and where each of the tabs 224 has a downward depression 226, such that lower surfaces 219 of the tabs 226 are positioned above the upper surface 319 of the solder pads 212, 214 of both the first and second solar cells 202, 204. The fourth operation 516 can include pinning the first interconnect 220 against a work surface 242 by pressing a hold down pin 250 against the main body 222 of the first interconnect 220 such that the lower surfaces 229 of the interconnect tabs 224 are maintained substantially parallel to the upper surfaces 219 of the solder pads 212, 214, and such that the depression of each of the tabs 224 substantially flatly contacts one of the solder pads 212, 214. The last operation 518 can include forming a solder paste 216 into a liquid state 217 uniformly spread around the depression 226 between the interconnect tabs 224 and solder pads 212, 214 thereby forming an electrical connection between the first and second solar cells 202, 204. Additionally, as noted above with regard to the operation 506, the last operation 518 can include pressing down the main body 222 with sufficient force to cause liquid solder to flow outwardly from the lower surface of the depression 226 toward a periphery of the depression 226 and so as to collect in a second layer of solder around the periphery of the lower surface of the depression 226.

Figure 41:
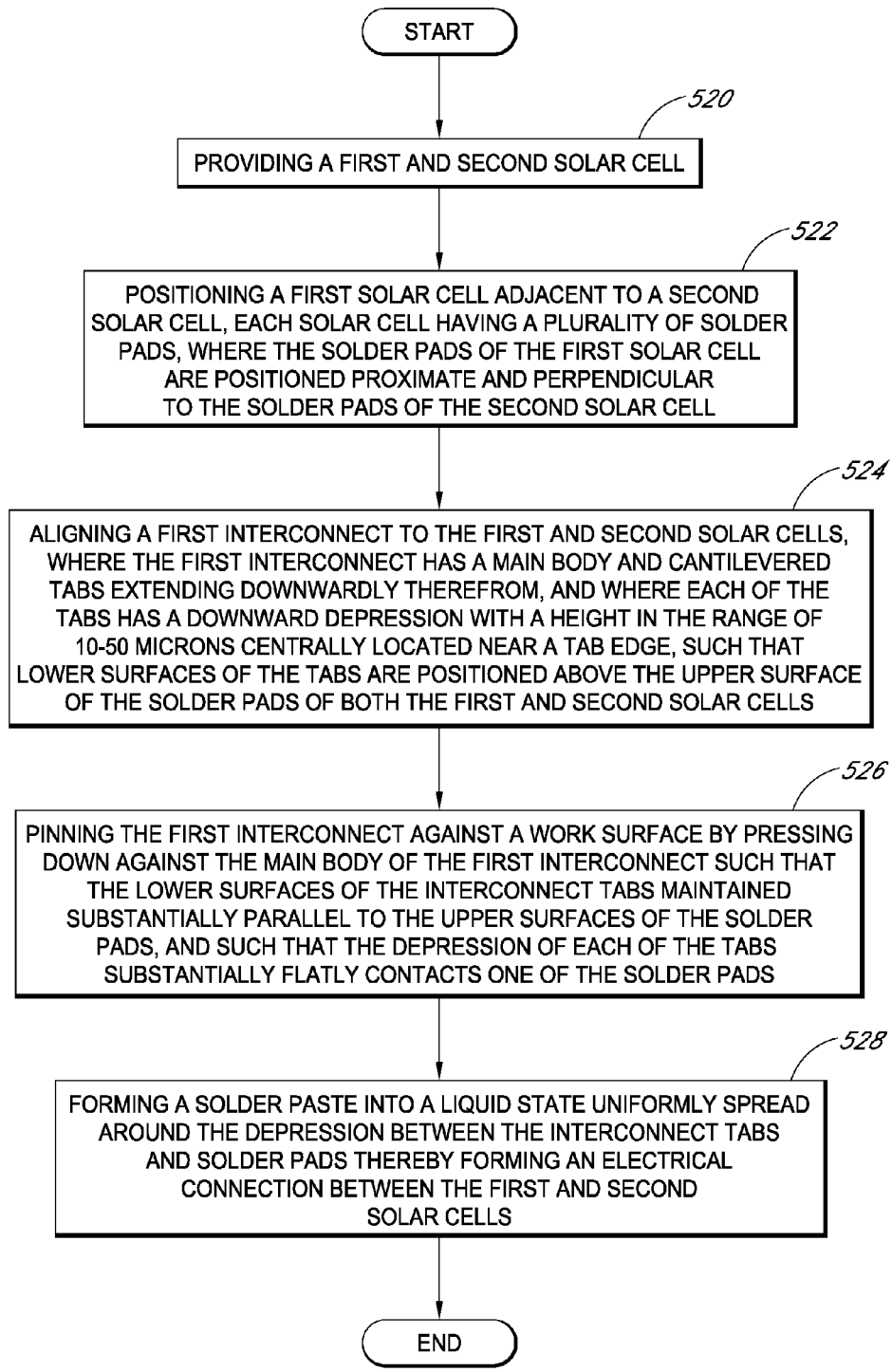

FIG. 41 illustrates a flow chart of still another embodiment for electrically connecting a plurality of solar cells. As discussed above, the first operation 520 can include providing a first and second solar cell 202, 204. The second operation 522 can include positioning a first solar cell 202 adjacent to a second solar cell 204, each solar cell having a plurality of solder pads 212, 214, where the solder pads 212, of the first solar cell 202 are positioned proximate and perpendicular to the solder pads 214 of the second solar cell 204. The third operation 524 can include aligning a first interconnect 220 to the first and second solar cells 202, 204, where the first interconnect 220 has a main body 222 and cantilevered tabs 225 extending downwardly therefrom, and where each of the tabs 225 has a downward depression 226 with a height in the range of 10-50 microns centrally located near a tab 225 edge, such that lower surfaces 229 of the tabs 225 are positioned above the upper surface 219 of the solder pads 212, 214 of both the first and second solar cells. The fourth operation 526 can include pinning the first interconnect 220 against a work surface 242 by pressing down against the main body 222 of the first interconnect 220 such that the lower surfaces 229 of the interconnect tabs 225 maintained substantially parallel to the upper surfaces 219 of the solder pads 212, 214, and such that the depression 226 of each of the tabs 225 substantially flatly contacts one of the solder pads 212, 214. The last operation 528 can include forming a solder paste 217 into a liquid state uniformly spread around the depression 226 between the interconnect tabs 225 and solder pads 212, 214 thereby forming an electrical connection between the first and second solar cells 202, 204. In an embodiment the cantilevered tabs 225 can instead be the interconnect tabs 224 discussed above. Additionally, as noted above with regard to the operation 506, the last operation 528 can include pressing down the main body 222 with sufficient force to cause liquid solder to flow outwardly from the lower surface of the depression 226 toward a periphery of the depression 226 and so as to collect in a second layer of solder around the periphery of the lower surface of the depression 226.

Figure 42:
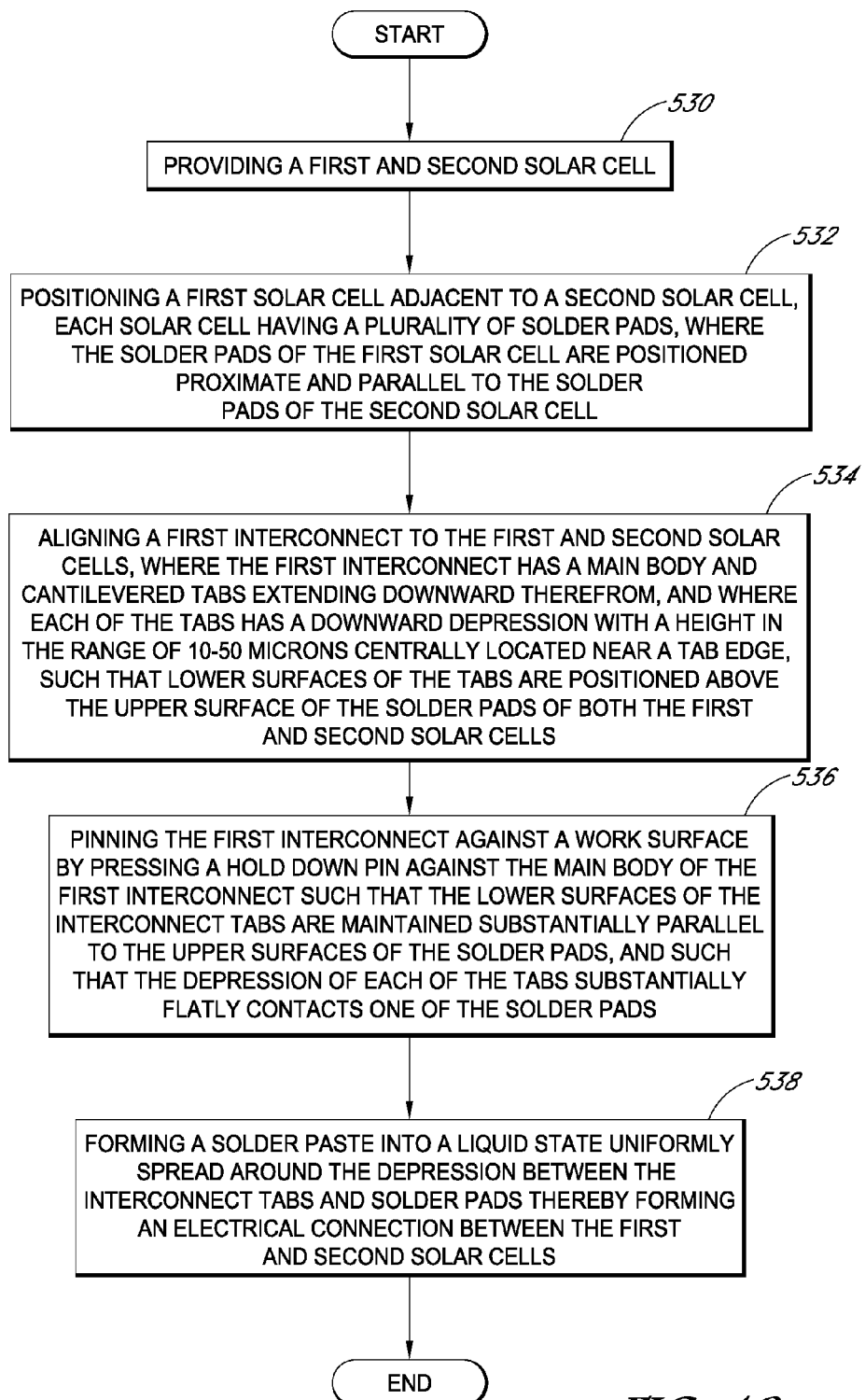

With reference to FIG. 42, there is shown a flow chart of yet another embodiment for electrically connecting a plurality of solar cells. The first operation 530 can include providing a first and second solar cell 302, 304. The second operation 532 can include positioning a first solar cell 302 adjacent to a second solar cell 304, each solar cell having a plurality of solder pads 312, 314, where the solder pads 312 of the first solar cell 302 are positioned proximate and parallel to the solder pads 314 of the second solar cell 304. The third operation 534 can include aligning a first interconnect 320 to the first and second solar cells 302, 304, where the first interconnect 320 has a main body 322 and cantilevered tabs 325 extending downward therefrom, and where each of the tabs 325 has a downward depression 326 with a height in the range of 10-50 microns centrally located near a tab edge, such that lower surfaces 329 of the tabs 325 are positioned above the upper surface 319 of the solder pads 312, 314 of both the first and second solar cells 302, 304. The fourth operation 534 can include pinning the first interconnect 320 against a work 342 surface by pressing a hold down pin 350 against the main body 322 of the first interconnect 320 such that the lower surfaces 329 of the interconnect tabs 325 are maintained substantially parallel to the upper surfaces 319 of the solder pads 312, 314, and such that the depression 226 of each of the tabs 325 substantially flatly contacts one of the solder pads 312, 314. The last operation 538 can include forming a solder paste into a liquid state 317 uniformly spread around the depression 326 between the interconnect tabs 325 and solder pads 312, 314 thereby forming an electrical connection between the first and second solar cells 302, 304. In an embodiment, the cantilevered tabs 325 can instead be the interconnect tabs 324 discussed above. Additionally, as noted above with regard to the operation 506, the last operation 538 can include pressing down the main body 222 with sufficient force to cause liquid solder to flow outwardly from the lower surface of the depression 226 toward a periphery of the depression 226 and so as to collect in a second layer of solder around the periphery of the lower surface of the depression 226.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar power system comprising:
   a first solar cell;
   a second solar cell adjacent the first solar cell, each of the first and second solar cells having a plurality of solder pads; and
   an interconnect aligned with the first and second solar cells, the interconnect having a main body and a plurality of tabs extending from the main body, each tab having a downward depression extending towards the first solar cell or the second solar cell,
   wherein lower surfaces of the tabs are positioned above and coupled to corresponding upper surfaces of the solder pads of the first and second solar cells.

2. The solar power system of claim 1), further comprising a solder joint formed around a periphery of the downward depression between the interconnect tab and corresponding solder pad to form an electrical connection between the first and second solar cells.

3. The solar power system of claim 1), wherein the downward depression comprises a first downwardly facing surface and a projection with a second downwardly facing surface spaced from the first downwardly facing surface.

4. The solar power system of claim 3), wherein the first downwardly facing surface extends around a periphery of the second downwardly facing surface.

5. The solar power system of claim 1), wherein lower surfaces of the tabs are substantially parallel to the corresponding upper surfaces of the solder pads.

6. The solar power system of claim 1), wherein the plurality of tabs extend from a single side of the main body of the interconnect.

7. The solar power system of claim 1), wherein the plurality of tabs extend from two opposing sides of the main body of the interconnect.

8. The solar power system of claim 1), wherein the solder pads of the first solar cell are proximate and substantially parallel to the solder pads of the second solar cell.

9. The solar power system of claim 1), wherein the solder pads of the first solar cell are proximate and substantially perpendicular to the solder pads of the second solar cell.

10. The solar power system of claim 1), wherein a height of the downward depression is in a range of about 10 microns to about 50 microns.

11. The solar power system of claim 1), wherein the first solar cell comprises one of a back-contact solar cell, a front-contact solar cell, a monocrystalline silicon solar cell, a polycrystalline silicon solar cell, an amorphous silicon solar cell, a thin film silicon solar cell, a copper indium gallium selenide (CIGS) solar cell, and a cadmium telluride solar cell.

12. The solar power system of claim 1), wherein the downward depression comprises at least one of a circular depression, oblong depression, triangular depression, square depression, polygon depression, rectangular depression, rounded-edge rectangular depression, dimple depression, partially hollowed depression, stamped out depression and concave depression.

13. The solar power system of claim 1), wherein the tabs comprise cantilevered tabs extending downwardly from the main body of the interconnect.

14. A solar power system comprising:
a first solar cell having a plurality of solder pads;
an interconnect having a plurality of tabs, each tab having a first downwardly facing surface and a projection with a second downwardly facing surface spaced from the first downwardly facing surface; and
a plurality of solder joints coupling the interconnect to the first solar cell, each of the solder joints formed around a periphery of the second downwardly facing surface between the interconnect tab and a corresponding solder pad of the first solar cell.

15. The solar power system of claim 14), further comprising a second solar cell coupled to the interconnect on a side of the interconnect opposite the first solar cell.

16. The solar power system of claim 14), further comprising a second solar cell coupled to the interconnect on the same side of the interconnect as the first solar cell.

17. The solar power system of claim 14), wherein the first downwardly facing surface extends around a periphery of the second downwardly facing surface.

18. The solar power system of claim 14), wherein the first downwardly facing surface is parallel to the second downwardly facing surface.

19. A solar power system comprising:
a first solar cell;
a second solar cell, each of the first and second solar cells having a plurality of solder pads; and
an interconnect coupling the first solar cell and the second solar cell, the interconnect comprising means for defining an annular solder joint between a portion of the interconnect and a corresponding solder pad of the first solar cell or the second solar cell; and
an annular solder joint formed around a periphery of the defining means to form an electrical connection between the first and second solar cells.

* * * * *